US006868002B2

(12) United States Patent
Saito et al.

(10) Patent No.: US 6,868,002 B2
(45) Date of Patent: *Mar. 15, 2005

(54) MAGNETIC MEMORY WITH REDUCED WRITE CURRENT

(75) Inventors: Yoshiaki Saito, Kawasaki (JP);
Koichiro Inomata, Sendai (JP);
Minoru Amano, Kawasaki (JP);
Kentaro Nakajima, Tokyo (JP);
Masayuki Sagoi, Yokohama (JP);
Tatsuya Kishi, Yokohama (JP); Shigeki Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/771,537

(22) Filed: Feb. 5, 2004

(65) Prior Publication Data

US 2004/0156231 A1 Aug. 12, 2004

Related U.S. Application Data

(62) Division of application No. 10/357,217, filed on Feb. 4, 2003, now Pat. No. 6,707,711, which is a division of application No. 09/912,321, filed on Jul. 26, 2001, now Pat. No. 6,556,473.

(30) Foreign Application Priority Data

Jul. 27, 2000 (JP) ........................................ 2000-227320
May 25, 2001 (JP) ........................................ 2001-157484

(51) Int. Cl.[7] ............................................... G11C 11/00
(52) U.S. Cl. ........................ 365/158; 365/158; 365/117
(58) Field of Search ................................ 365/158, 117, 365/74, 65, 173, 8, 185.07; 360/324.3; 257/30, 421, 315

(56) References Cited

U.S. PATENT DOCUMENTS 5,173,873 A 12/1992 Wu et al.
5,659,499 A 8/1997 Chen et al.
5,757,056 A 5/1998 Chui (List continued on next page.)

FOREIGN PATENT DOCUMENTS

JP 10-4227 1/1998
WO WO 00/10172 2/2000

OTHER PUBLICATIONS

J.S. Moodera, et al., J. Appl. Phys., vol. 79, No. 8, pp. 4724–4729, "Ferromagnetic–Insulator–Ferromagnetic Tunneling: Spin–Dependent Tunneling and Large Magnetoresistance in Trilayer Junctions (Invited)," Apr. 15, 1996.

L.F. Schelp, et al., Physical Review B, vol. 56, No. 10, pp. R5747–R5750, "Spin–Dependent Tunneling with Coulomb Blockade," Sep. 1, 1997.

(List continued on next page.)

Primary Examiner—David Nelms
Assistant Examiner—Thinh T Nguyen
(74) Attorney, Agent, or Firm—Oblon, Spivak, McClelland, Maier & Neustadt, P.C.

(57) ABSTRACT

There is provided a magnetic memory including first and second wirings intersecting each other and disposed apart from each other, a magnetoresistance effect film positioned between the first and second wirings, and a first magnetic film including a first portion facing the magnetoresistance effect film with the first wiring interposed therebetween and a pair of second portions positioned on both sides of the first wiring and magnetically connected to the first portion, each of the first and second portions having either one of a high saturation magnetization soft magnetic material containing cobalt and a metal-nonmetal nano-granular film.

44 Claims, 7 Drawing Sheets

U.S. PATENT DOCUMENTS

| | | |
|---|---|---|
| 5,768,181 A | 6/1998 | Zhu et al. |
| 5,838,608 A | 11/1998 | Zhu et al. |
| 5,940,319 A | 8/1999 | Durlam et al. |
| 5,956,267 A | 9/1999 | Hurst et al. |
| 6,054,734 A | 4/2000 | Aozana et al. |
| 6,072,718 A | 6/2000 | Abraham et al. |
| 6,178,074 B1 | 1/2001 | Gill |
| 6,201,259 B1 * | 3/2001 | Sato et al. .................. 257/30 |
| 6,205,052 B1 | 3/2001 | Slaughter et al. |
| 6,233,172 B1 | 5/2001 | Chen et al. |
| 6,556,473 B2 * | 4/2003 | Saito et al. ................ 365/158 |
| 6,707,711 B2 * | 3/2004 | Saito et al. ................ 365/158 |

OTHER PUBLICATIONS

Y. Saito, et al., J. Magnetic. Soc., vol. 23, No. 4–2, pp. 1269–1272, "Spin–Dependent Tunneling Through Layered Hard–Magnetic Nano–Particles," 1999.

F. Montaigne, et al., Applied Physics Letters, vol. 73, No. 19, pp. 2829–2831, "Enhanced Tunnel Magnetoresistance at High Bias Voltage in Double–Barrier Planar Junctions," Nov. 9, 1998.

* cited by examiner

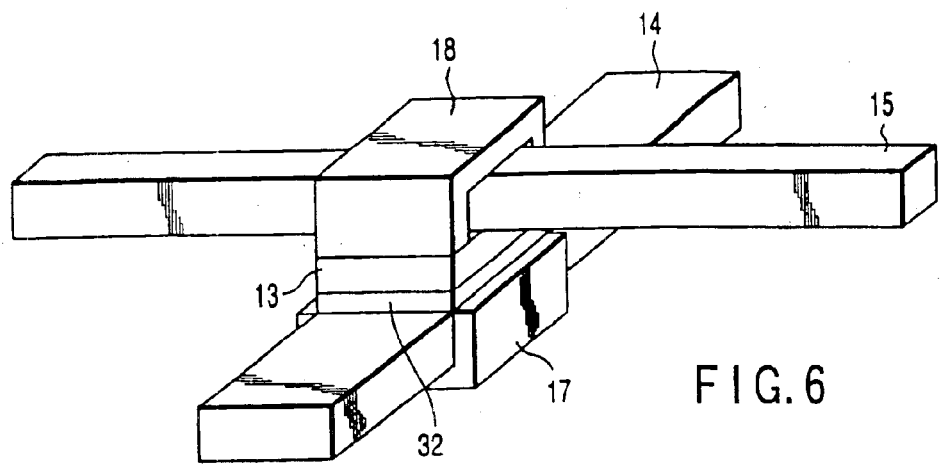
FIG. 6
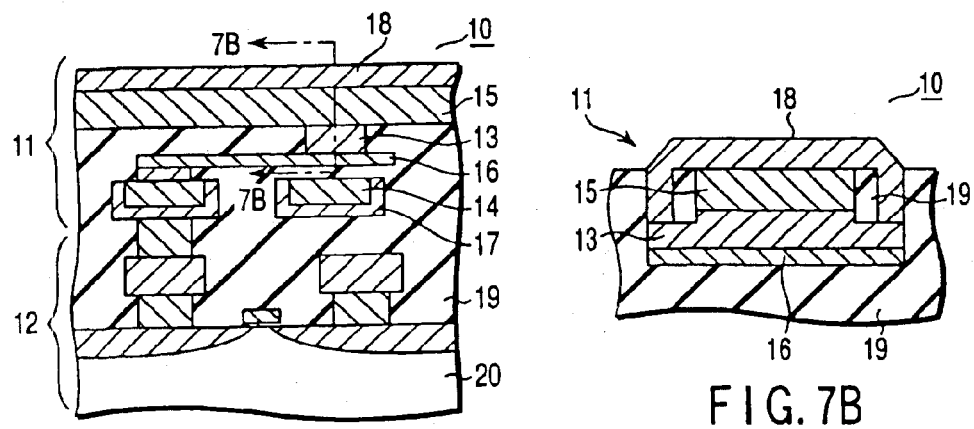
FIG. 7A
FIG. 7B
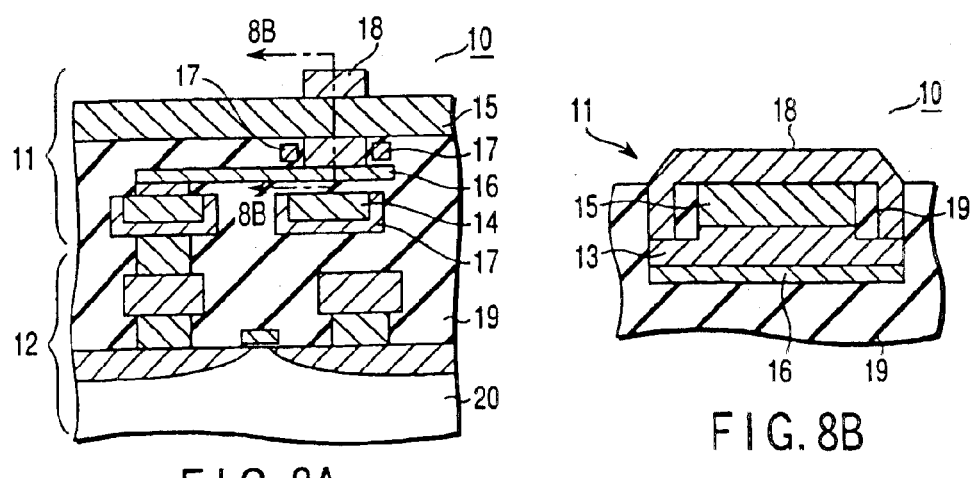
FIG. 8A
FIG. 8B

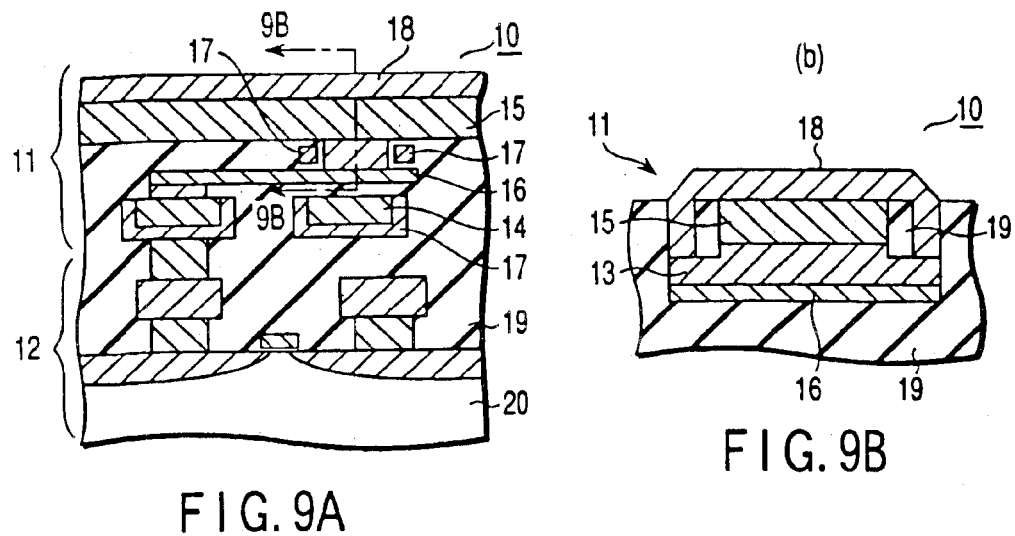
FIG. 9A
FIG. 9B
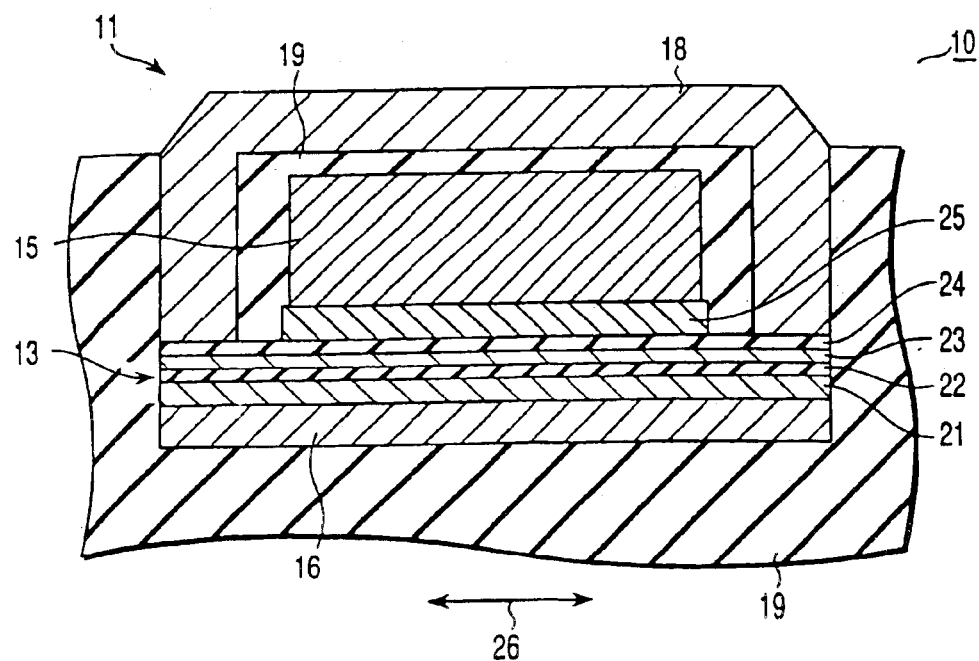
FIG. 10

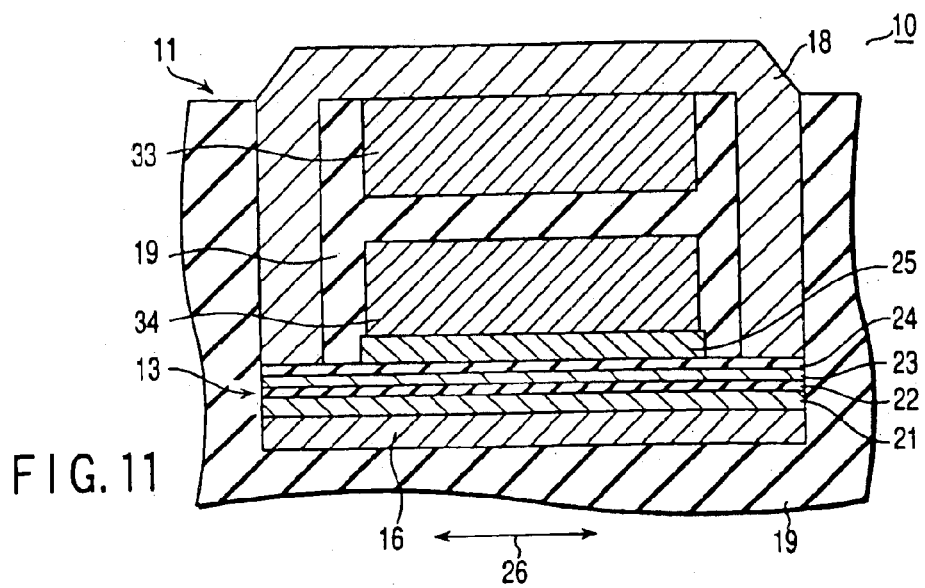
FIG. 11
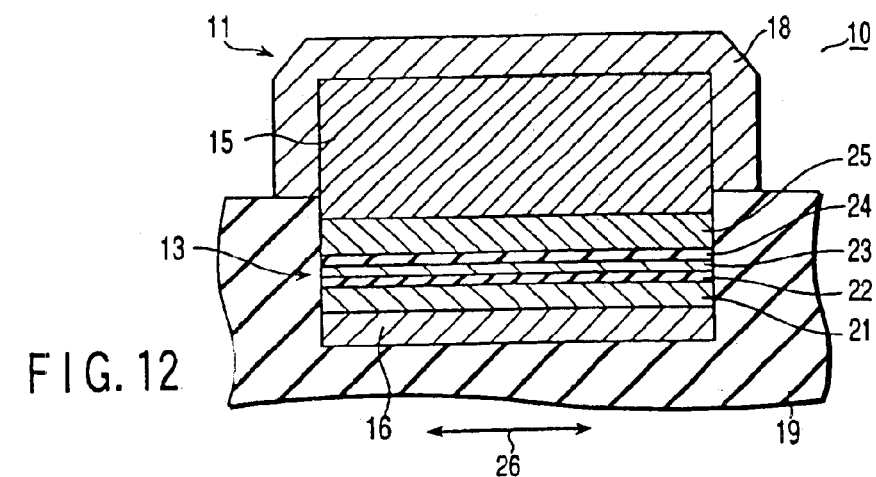
FIG. 12
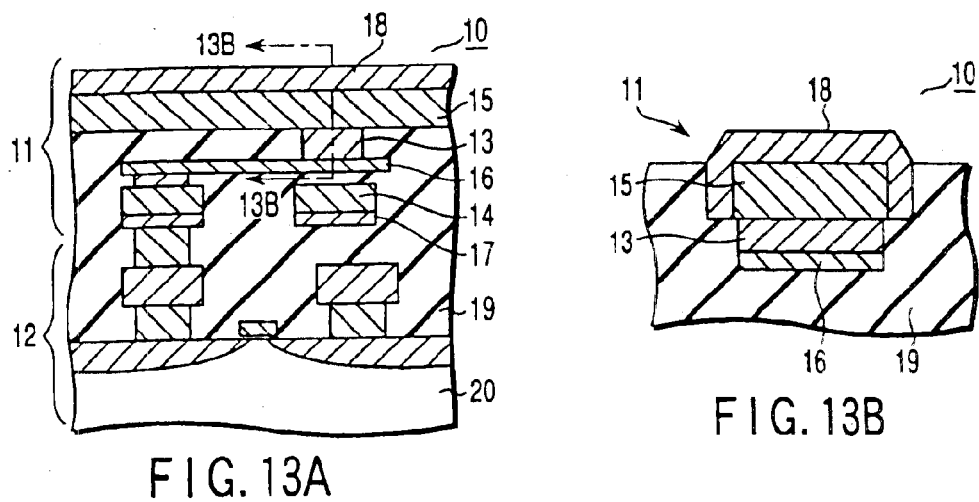
FIG. 13A
FIG. 13B

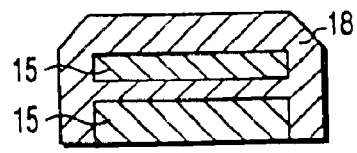
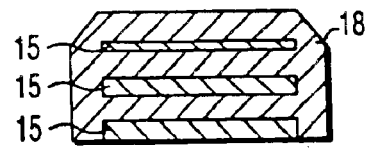
FIG. 14A    FIG. 14B
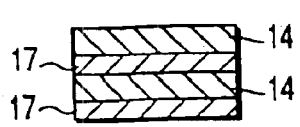
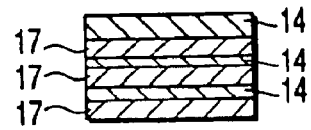
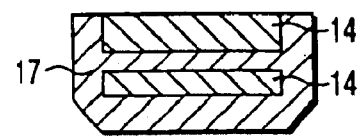
FIG. 15A    FIG. 15B    FIG. 15C
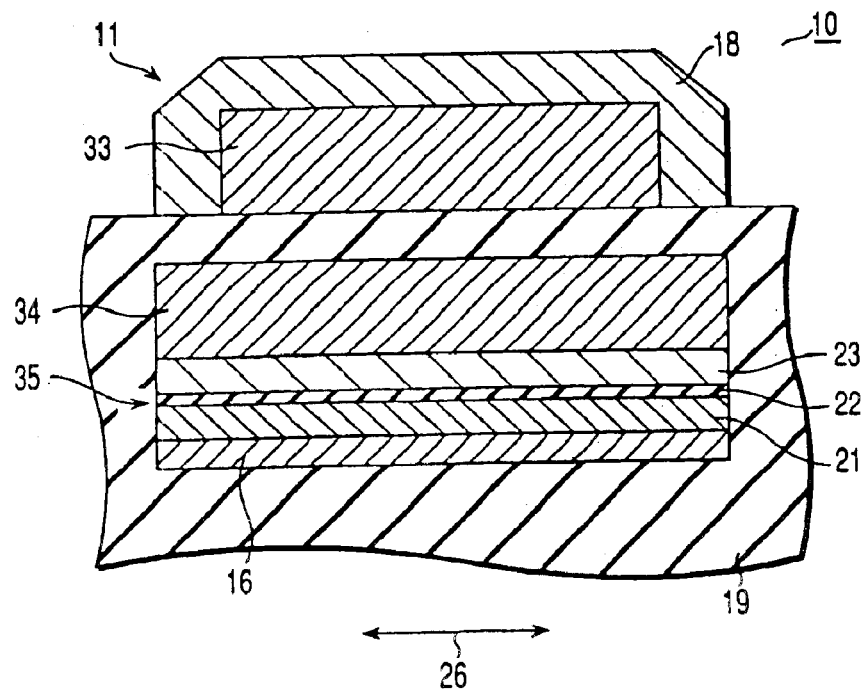
FIG. 16

MAGNETIC MEMORY WITH REDUCED WRITE CURRENT

This application is a Divisional of Ser. No. 10/357,217 filed on Feb. 4, 2003 now U.S. Pat. No. 6,707,711, which is a DIV of Ser. No. 09/912,321 filed Jul. 26, 2001, now U.S. Pat. No. 6,556,473.

CROSS-REFERENCE TO RELATED APPLICATIONS

This application is based upon and claims the benefit of priority from the prior Japanese Patent Applications No. 2000-227320, filed Jul. 27, 2000; and No. 2001-157484, filed May 25, 2001, the entire contents of both of which are incorporated herein by reference.

BACKGROUND OF THE INVENTION

1. Field of the Invention

The present invention relates to a magnetic memory.

2. Description of the Related Art

A magnetoresistance effect device using a magnetic film has already been used as a magnetic head or a magnetic sensor. Moreover, it is also proposed to use the magnetoresistance effect device as a magnetic memory (magnetoresistance effect memory), and the like. In the magnetic memory, a magnetic memory using a ferromagnetic tunnel junction is expected to realize a nonvolatile storage, and a writing or reading access time less than 10 nsec, reading and writing endurance exceeding $10^{15}$ times, and small cell size like DRAM.

To realize such a magnetic memory using the ferromagnetic tunnel junction, a sufficient magneto-resistance ratio is necessary. In recent years, the magnetoresistance ratio of 20% or more has been achieved in the ferromagnetic tunnel junction. Therefore, expectation of realizing such a magnetic memory is increased more and more.

For example, a ferromagnetic tunnel junction obtained by forming a thin Al film having a thickness of 0.7 nm to 2.0 nm on a ferromagnetic layer, exposing the surface of the film to an oxygen glow electric discharge or an oxygen gas to form a tunnel barrier layer of $Al_2O_3$, and further forming a ferromagnetic layer has been proposed. According to the ferromagnetic tunnel junction, the magnetoresistance ratio of 20% or more is obtained (J. Appl. Phys. 79, 4724 (1996)). Moreover, a structure of a ferromagnetic single tunnel junction has also been proposed in which one layer of a, pair of ferromagnetic layers is combined with an antiferromagnetic layer to form a magnetization pinned layer (Jpn. Pat. Appln. KOKAI Publication No. 10-1998).

As described above, in the ferromagnetic single tunnel junction, the magnetoresistance ratio of 20% or more can be obtained. However, as compared with competing memories such as FeRAM and flash memory, the magnetic memory using the ferromagnetic single tunnel junction has a problem that power consumption on writing is large.

To solve the problem, a solid magnetic memory has been proposed in which a thin film of a high permeability material is formed around a writing wiring (U.S. Pat. Nos. 5,659,499, 5,956,267, and 5,940,319, and International Patent Application No. WO00/10172). According to this magnetic memory, since the high permeability film is formed around the wiring, a current value necessary for writing information to a magnetic recording layer can efficiently be reduced. Moreover, according to the magnetic memory, since a magnetic flux generated by the current does not extend to the outside of the high permeable magnetic film, even a cross talk can be inhibited.

However, in the magnetic memory disclosed in the U.S. Pat. No. 5,659,499, a magnetic field cannot uniformly be applied to the whole recording layer of a magnetoresistance effect film. Moreover, in the magnetic memory disclosed in the U.S. Pat. Nos. 5,956,267 and 5,940,319, when a structure of the magnetic recording layer positioned between a pair of magnetization pinned layers like in a dual spin valve type double tunnel junction as described later is used, it is difficult to efficiently apply the magnetic field to the magnetic recording layer. Furthermore, the magnetic memory disclosed in the International Patent Application No. WO00/10172 has an ideal structure for applying the magnetic field to the magnetic recording layer, but it is remarkably difficult to manufacture the structure.

Moreover, in addition to the aforementioned ferromagnetic single tunnel junction, a ferromagnetic tunnel junction in which a magnetic particle is dispersed in a dielectric material, and a ferromagnetic double tunnel junction (continuous film) have also been proposed. Even in these ferromagnetic tunnel junctions, the magnetoresistance ratio of 20% or more is obtained (Phys. Rev. B 56(10), R5747 (1997)., Applied Magnetics Journal 23, 4-2 (1999), Appl. Phys. Lett. 73(19), 2829(1998)). Additionally, according to the ferromagnetic double tunnel junction, the magnetoresistance ratio generated by increasing a voltage value applied to the magnetic tunnel junctions can be prevented from decreasing in order to obtain a desired signal voltage value.

However, the ferromagnetic double tunnel junction also has a problem that the power consumption on writing is large similarly as the ferromagnetic single tunnel junction. Moreover, when the ferromagnetic double tunnel junction is used, the magnetic recording layer is held between a pair of tunnel barrier layers and a pair of magnetization pinned layers. Therefore, even when the method disclosed in the aforementioned U.S. patent is applied, an electric current magnetic field cannot efficiently act on the magnetic recording layer. That is, the magnetic memory using the ferromagnetic double tunnel junction has a problem that the power consumption on writing is remarkably large.

BRIEF SUMMARY OF THE INVENTION

An object of the present invention is to provide a magnetic memory in which a power consumption on writing can be reduced.

According to a first aspect of the present invention, there is provided a magnetic memory comprising first and second wirings intersecting each other and positioned apart from each other, a magnetoresistance effect film positioned between the first and second wirings and comprising a magnetic recording layer configured to reverse a magnetization direction thereof by changing a direction of a magnetic field, which is generated by passing writing currents through the first and second wirings, between a first direction and a second direction different from the first direction, a magnetization pinned layer configured to hold the magnetization direction thereof when the direction of the magnetic field is changed between the first direction and the second direction, and a nonmagnetic layer intervening between the magnetic recording layer and the magnetization pinned layer, and a first magnetic film comprising a first portion facing the magnetoresistance effect film with the first wiring interposed therebetween and a pair of second portions positioned on both sides of the first wiring and magnetically connected to the first portion, each of the first and second portions comprising either one of a high saturation magnetization soft magnetic material containing cobalt and a metal-nonmetal nano-granular film.

According to a second aspect of the present invention, there is provided a magnetic memory comprising first and second wirings intersecting each other and positioned apart from each other, a magnetoresistance effect film positioned between the first and second wirings and comprising a magnetic recording layer configured to reverse a magnetization direction thereof by changing a direction of a magnetic field, which is generated by passing writing currents through the first and second wirings, between a first direction and a second direction different from the first direction, first and second magnetization pinned layers sandwiching the magnetic recording layer and each configured to hold a magnetization direction thereof when the direction of the magnetic field is changed between the first direction and the second direction, a first nonmagnetic layer intervening between the first magnetization pinned layer and the magnetic recording layer, and a second nonmagnetic layer intervening between the second magnetization pinned layer and the magnetic recording layer, and a first magnetic film comprising a first portion facing the magnetoresistance effect film with the first wiring interposed therebetween and a pair of second portions positioned on both sides of the first wiring and magnetically connected to the first portion, each of the first and second portions comprising either one of a high saturation magnetization soft magnetic material containing cobalt and a metal-nonmetal nano-granular film.

According to a third aspect of the present invention, there is provided a magnetic memory comprising first and second wirings intersecting each other and positioned apart from each other, a magnetoresistance effect film positioned between the first and second wirings and comprising a magnetic recording layer configured to reverse a magnetization direction thereof by changing a direction of a magnetic field, which is generated by passing writing currents through the first and second wirings, between a first direction and a second direction different from the first direction, first and second magnetization pinned layers sandwiching the magnetic recording layer and each configured to hold a magnetization direction thereof when the direction of the magnetic field is changed between the first direction and the second direction, a first nonmagnetic layer intervening between the first magnetization pinned layer and the magnetic recording layer, and a second nonmagnetic layer intervening between the second magnetization pinned layer and the magnetic recording layer, and a first magnetic film comprising a first portion facing the magnetoresistance effect film with the first wiring interposed therebetween and a pair of second portions positioned on both sides of the first wiring and magnetically connected to the first portion, the second portions being in contact with one of the first and second nonmagnetic layers which is closer to the first magnetic film than the other of the first and second nonmagnetic layers.

According to a fourth aspect of the present invention, there is provided a magnetic memory comprising first and second wirings intersecting each other and positioned apart from each other, a magnetoresistance effect film positioned between the first and second wirings and comprising a magnetic recording layer configured to reverse a magnetization direction thereof by changing a direction of a magnetic field, which is generated by passing writing currents through the first and second wirings, between a first direction and a second direction different from the first direction, first and second magnetization pinned layers sandwiching the magnetic recording layer and each configured to hold a magnetization direction thereof when the direction of the magnetic field is changed between the first direction and the second direction, a first nonmagnetic layer intervening between the first magnetization pinned layer and the magnetic recording layer, and a second nonmagnetic layer intervening between the second magnetization pinned layer and the magnetic recording layer, and a first magnetic film comprising a first portion facing the magnetoresistance effect film with the first wiring interposed therebetween and a pair of second portions positioned on both sides of the first wiring and magnetically connected to the first portion, the magnetic recording layer being positioned between the second portions.

In the first to fourth aspects of the present invention, when the current is passed through the first wiring, the first magnetic film provides a flux path for a generated magnetic force line or magnetic flux. Also, the magnetic memory according to first to fourth aspects of the present invention may have a ferromagnetic tunnel junction in which the nonmagnetic layer is a nonmagnetic tunnel layer (tunnel barrier layer), or else, may have a so-called giant magnetoresistance (GMR) effect film in which the nonmagnetic layer is not the tunnel barrier layer.

When the first to fourth aspects of the present invention define a ferromagnetic tunnel junction having a structure in which the magnetization pinned layer with the fixed magnetization direction, nonmagnetic tunnel layer, and magnetic recording layer with the reversible magnetization direction are successively laminated, this ferromagnetic tunnel junction includes not only a ferromagnetic single tunnel junction but also a ferromagnetic multiple tunnel junction. Alternatively, when the first to fourth aspects of the present invention define a ferromagnetic tunnel junction having a structure in which the first magnetization pinned layer with the fixed magnetization direction, first nonmagnetic tunnel layer, magnetic recording layer with the reversible magnetization direction, second magnetization pinned layer with the fixed magnetization direction, and second nonmagnetic tunnel layer are successively laminated, this ferromagnetic tunnel junction includes a ferromagnetic multiple tunnel junction.

When the magnetoresistance effect film has the first and second nonmagnetic layers, the first magnetic film can be magnetically connected to the magnetic recording layer via either nonmagnetic layer. This can be realized, for example, by employing the following structure. That is, a width of the first nonmagnetic layer and magnetic recording layer are set to be larger and the width of the first magnetization pinned layer is set to be smaller with respect to a distance between the surfaces of the first and second portions facing to each other. Thereby, the main surface of the first nonmagnetic layer is partially exposed in correspondence with the first and second portions. In this case, when the exposed portions of the first nonmagnetic layer are brought in contact with the first and second portions, the magnetic film is magnetically connected to the magnetic recording layer via the first nonmagnetic layer. Therefore, the magnetic flux generated by passing the current through the first wiring and passed through the first magnetic film can efficiently be applied to the magnetic recording layer. As a result, information can be written even when an amount of a current passed through the first wiring is small, and power consumption required for writing the information can be reduced.

Moreover, when the magnetoresistance effect film has the first and second nonmagnetic layers, the magnetic film providing the flux path can also be magnetically connected to the magnetic recording layer by the following structure. That is, the width of the first magnetization pinned layer, first nonmagnetic layer and magnetic recording layer is reduced, and set to be not more than the distance between the surfaces of the first and second portions facing to each other. In this case, when the magnetic recording layer is positioned between the first and second portions, the magnetic film can be magnetically connected to the magnetic recording layer. Therefore, the information can be written even when the amount of the current passed through the first wiring is small, and the power consumption required for writing the information can be reduced.

In the first to fourth aspects of the present invention, a length of the first magnetic film along a longitudinal direction of the first wiring may be 1.2 times or more, or 1.5 times or more the length of the magnetoresistance effect film along the longitudinal direction of the first wiring. Similarly, the length of the second magnetic film along the longitudinal direction of the second wiring may be 1.2 times or more, or 1.5 times or more the length of the magnetoresistance effect film along the longitudinal direction of the second wiring. In this case, the magnetic field can more effectively be applied to the magnetic recording layer.

The first and second wirings may contain one material selected from the group consisting of aluminum, copper, tungsten, and an alloy of these metals. Alternatively, the first and second wirings may have a multilayered structure including the nonmagnetic layer and high saturation magnetization soft magnetic material layer, such as a laminated structure of a Cu layer and CoFeNi layer. When the wirings are made of the material mainly containing Cu and the first and second magnetic films are alloy based films containing Co or Co—Fe as a main component, Cu and Co or Co—Fe are hardly dissolved in each other. Therefore, even when a usual heat treatment process is performed or an excessively large current is passed, Cu contained in the wiring and Co or Co—Fe contained in the magnetic film are not mutually diffused. Therefore, it is unnecessary to dispose a barrier metal between the wiring and the magnetic film.

Each of the first and second magnetic films can comprise a Co—Fe alloy film, a Co—Fe—Ni alloy film, an amorphous material film such as a Co-(Zr, Hf, Nb, Ta, Ti) film, a (Co, Fe, Ni)—(Si, B) based film, a (Co, Fe, Ni)—(P, Al, Mo, Nb, Mn) based film and a (Co, Fe, Ni)—(Si, B)—(P, Al, Mo, Nb, Mn) based film, and metal-nonmetal nano-granular films such as a (Fe, Co)—(B, Si, Hf, Zr, Sm, Ta, Al)—(F, O, N) based film. In more detail, these magnetic films may also comprise the high saturation magnetization soft magnetic material film containing a Co element, or the metal-nonmetal nano-granular films such as a (Fe, Co)—(B, Si, Hf, Zr, Sm, Ta, Al)—(F, O, N) based film.

It is noted that the metal-nonmetal nano-granular film may have a structure in which metal granules are dispersed in a nonmetal matrix. Alternatively, the metal-nonmetal nano-granular film may have a structure in which nonmetal granules are dispersed in a metal matrix.

The magnetization pinned layer and magnetic recording layer may contain Fe, Co, Ni, an alloy of these metals, and half metals such as NiMnSb, PtMnSb and $CO_2MnGe$. A saturation magnetization Bs of the magnetic recording layer may be more than 5 kG.

Moreover, examples of the material of the nonmagnetic tunnel layer include $Al_2O_3$, AlN, MgO, $SiO_2$, GaO, $LaAlO_3$, $MgF_2$, and $CaF_2$.

In the first to fourth aspects of the present invention, a magnetic film similar to the magnetic film around the first wiring may also be provided around the second wiring. Moreover, the magnetic film in the position of the ferromagnetic tunnel junction may also be extended over the whole wiring.

In the first to fourth aspects of the present invention, with respect to a size in a cross-section vertical to the longitudinal direction of the wiring around which the magnetic film is provided, assuming that the length of the magnetic film in an opening width direction is $l_1$, and the length thereof in a vertical direction is $l_2$, an aspect ratio $l_2/l_1$ may be larger than 1. In this case, the current magnetic field is strengthened. This aspect ratio $l_2/l_1$ may be larger than 1.5 and smaller than 5, or else, larger than 2 and smaller than 5.

The magnetic memory of the first to fourth aspects of the present invention can further comprise a sense current control device configured to control a sense current passed through the magnetic memory in order to read the information stored in the magnetic memory. As the sense current control device, a transistor or a diode can be used.

BRIEF DESCRIPTION OF THE SEVERAL VIEWS OF THE DRAWING

FIG. 6 is a perspective view schematically showing one example of a structure of a magnetic memory in which the circuit constitution shown in FIG. 5 is employed;

FIG. 7A is a sectional view schematically showing the magnetic memory according to a second embodiment of the present invention;

FIG. 7B is a partial sectional view taken along a line 7B—7B of the magnetic memory shown in FIG. 7A;

FIG. 8A is a sectional view schematically showing the magnetic memory according to a third embodiment of the present invention;

FIG. 8B is a partial sectional view taken along a line 8B—8B of the magnetic memory shown in FIG. 8A;

FIG. 9A is a sectional view schematically showing the magnetic memory according to a fourth embodiment of the present invention;

FIG. 9B is a partial sectional view taken along a line 9B—9B of the magnetic memory shown in FIG. 9A;

FIG. 10 is a sectional view schematically showing a part of the magnetic memory according to a fifth embodiment of the present invention;

FIG. 11 is a sectional view schematically showing a part of the magnetic memory according to a sixth embodiment of the present invention;

FIG. 12 is a sectional view schematically showing a part of the magnetic memory according to a seventh embodiment of the present invention;

FIG. 13A is a sectional view schematically showing the magnetic memory according to an eighth embodiment of the present invention;

FIG. 13B is a partial sectional view taken along a line 13B—13B of the magnetic memory shown in FIG. 13A;

FIGS. 14A and 14B are sectional views schematically showing structure examples of a wiring and magnetic film of the magnetic memory according to the eighth embodiment of the present invention;

FIGS. 15A to 15C are sectional views schematically showing structure examples of the wiring and magnetic film of the magnetic memory according to the eighth embodiment of the present invention; and FIG. 16 is a sectional view schematically showing a part of the magnetic memory according to a ninth embodiment of the present invention.

DETAILED DESCRIPTION OF THE INVENTION

Figure 1A:
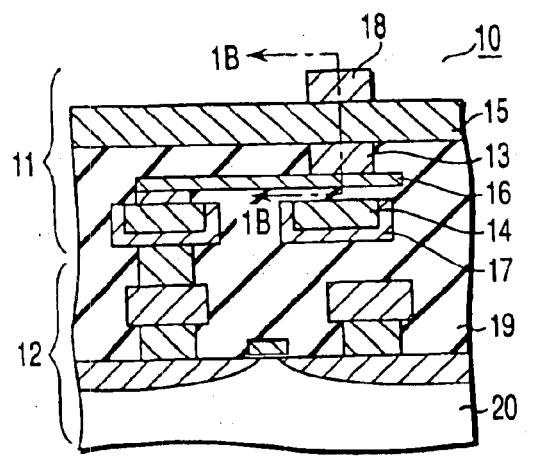
FIG. 1A is a sectional view schematically showing a magnetic memory according to a first embodiment of the present invention.

Embodiments of the present invention will be described in detail below with reference to the accompanying drawings. The same reference numerals denote the same parts in the drawing, and a duplicate explanation will be omitted.

Figure 1B:
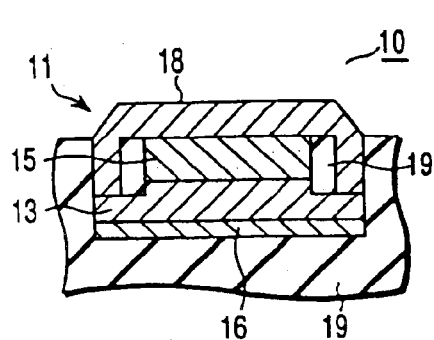
FIG. 1B is a partial sectional view taken along a line 1B—1B of the magnetic memory shown in FIG. 1A.
Figure 1C:
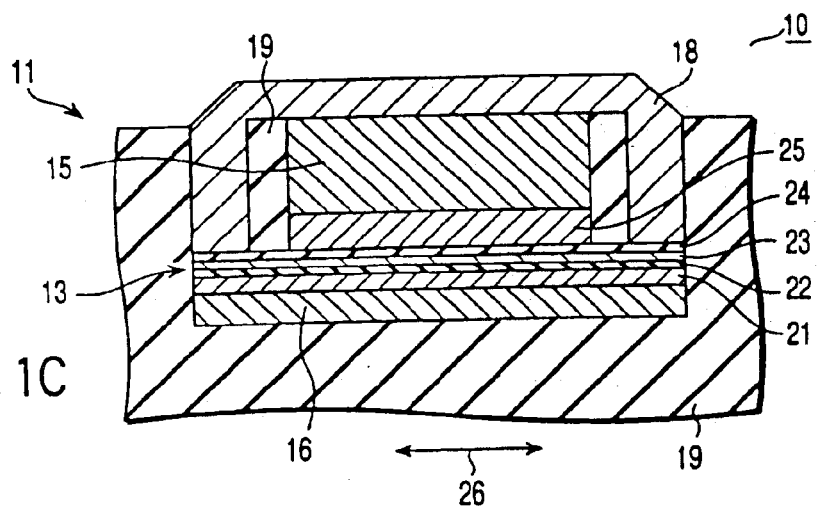
FIG. 1C is an enlarged sectional view of the structure shown in FIG. 1B.
Figure 1D:
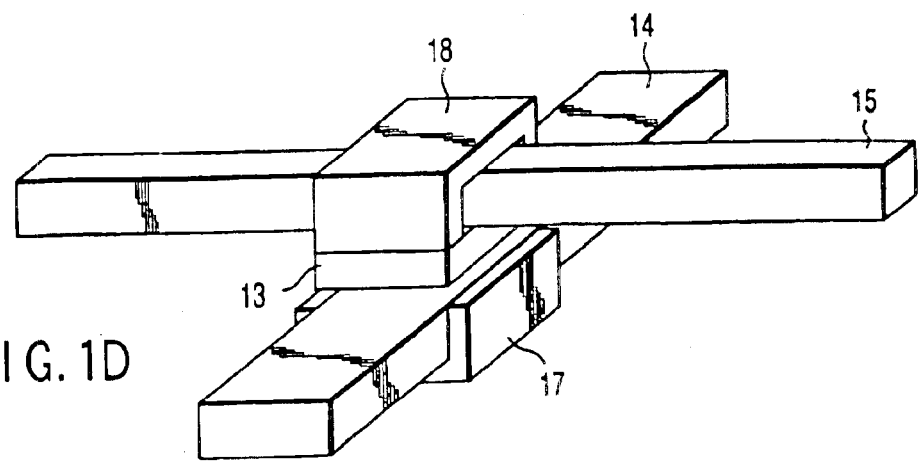
FIG. 1D is a perspective view schematically showing a part of the magnetic memory shown in FIG. 1A.

FIG. 1A is a sectional view schematically showing a magnetic memory according to a first embodiment of the present invention. FIG. 1B is a partial sectional view taken along a line 1B—1B of the magnetic memory shown in FIG. 1A, and FIG. 1C is an enlarged sectional view of a structure shown in FIG. 1B. Moreover, FIG. 1D is a perspective view schematically showing a part of the magnetic memory shown in FIG. 1A.

A magnetic memory 10 shown in FIGS. 1A to 1D is a magnetic random access memory (MRAM), and is, as shown in FIG. 1A, mainly constituted by a magnetic memory 11 and a transistor 12 as a sense current control device for controlling a sense current to be passed through the magnetic memory 11.

The magnetic memory 11 has a ferromagnetic double tunnel junction 13. The ferromagnetic double tunnel junction 13 is positioned between wirings 14, 15 crossing at right angles to each other, and a lower end of the tunnel junction is connected to the transistor 12 via a wiring 16. Moreover, magnetic films 17, 18 are provided around the wirings 14, 15, respectively. Furthermore, in the first embodiment, the magnetic film 18 is made of a high saturation magnetization soft magnetic material. It is noted that a reference numeral 19 denotes an interlayer insulating film, 20 denotes a substrate, and a double-arrow 26 denotes an axis of easy magnetization.

The ferromagnetic double tunnel junction 13 has a structure in which a magnetization pinned layer 21, tunnel barrier layer 22, magnetic recording layer 23, tunnel barrier layer 24, and magnetization pinned layer 25 are laminated in the order noted above from a wiring 16 side. A width of the magnetization pinned layer 25 is smaller than that of the magnetization pinned layer 21, tunnel barrier layer 22, magnetic recording layer 23, and tunnel barrier layer 24, and upper surfaces of the tunnel barrier layer 24 positioned on opposite sides of the wiring 15 are exposed. Both ends of the magnetic film 18 opened on a magnetization pinned layer 25 side contact the exposed upper surfaces of the tunnel barrier layer 24, respectively. That is, the magnetic film 18 is magnetically connected to the tunnel barrier layer 24, and to the magnetic recording layer 23 via the tunnel barrier layer 24.

When the magnetic film 18 is in contact with the magnetization pinned layer 25, the magnetic film 18 is magnetically connected to the magnetization pinned layer 25. Therefore, a current magnetic field cannot effectively act on the magnetic recording layer 23. On the other hand, in the structure shown in FIG. 1C, since the magnetic film 18 is connected to the magnetic recording layer 23 only via the tunnel barrier layer 24, the current magnetic field can effectively act on the magnetic recording layer 23.

It is noted that, with this structure, reduction of power consumption to about 1/5 or less has been confirmed. It is also noted that, a principle for reducing the power consumption has been described only for the magnetic film 18, but this principle also can be applied to the magnetic film 17.

Instead of the structure described with reference to FIGS. 1A to 1D, structures shown in FIGS. 2A and 2B may also be employed.

Figure 2A:
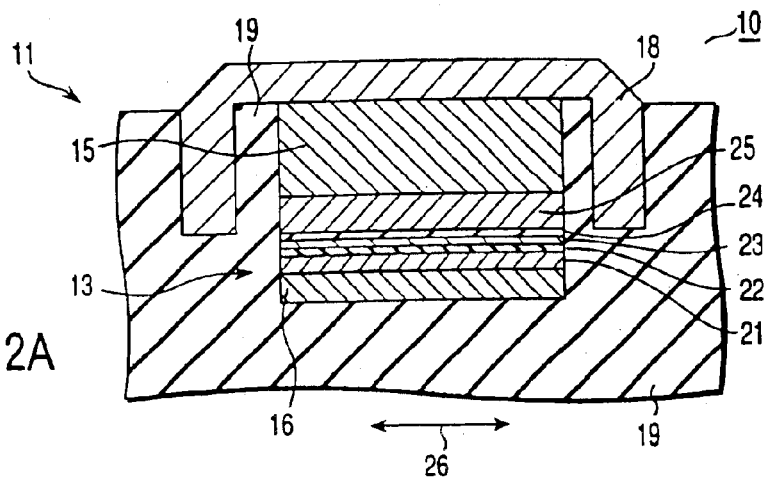
FIGS. 2A and 2B are sectional views schematically showing modification examples of the structure shown in FIGS. 1A to 1D.
Figure 2B:
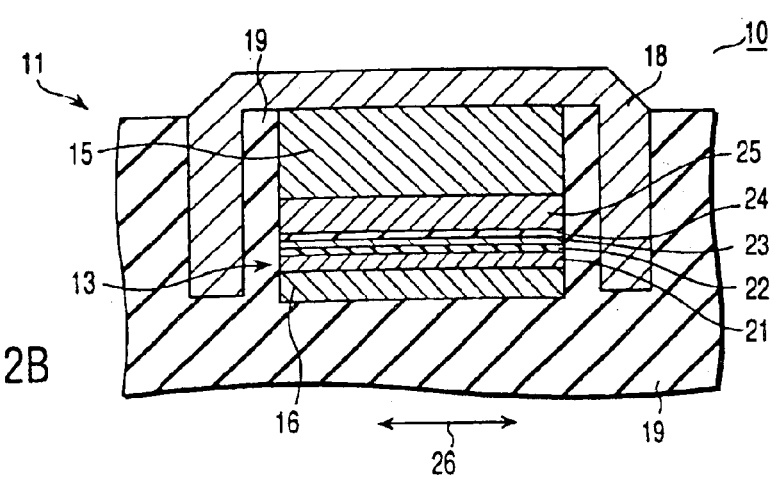

FIGS. 2A and 2B are sectional views schematically showing modification examples of the structure shown in FIGS. 1A to 1D.

In the magnetic memory 10 shown in FIG. 2A, the width of the magnetization pinned layer 25 is smaller than an opening width of the magnetic film 18, and the magnetization pinned layer 25 is positioned between sidewall portions of the magnetic film 18. In this structure, the current magnetic field can also effectively act on the magnetic recording layer 23.

In the magnetic memory 10 shown in FIG. 2B, the width of the magnetization pinned layer 25 is smaller than the opening width of the magnetic film 18, and the magnetic recording layer 23 is positioned between the sidewall portions of the magnetic film 18. In this structure, the current magnetic field can also effectively act on the magnetic recording layer 23. Moreover, according to the structure, the magnetic recording layer 23 is positioned between the sidewall portions of the magnetic film 18. Therefore, when a writing magnetic field is applied to one of two storage cells adjacent to each other, an influence of the writing magnetic field onto the magnetic recording layer 23 of the other cell is reduced. Therefore, according to the structure shown in FIG. 2B, not only the reduction of the power consumption on writing is achieved but also cross talk can more effectively be prevented.

In the first embodiment, a saturation magnetization Bs of the high saturation magnetization soft magnetic material for use in the magnetic films 17, 18 is preferably larger than 5 kG. When the saturation magnetization Bs is larger than 5 kG, the effect of reducing the power consumption conspicuously appears.

Moreover, the length of the magnetic film 17 along the longitudinal direction of the wiring 14 is preferably more than the length of the magneto-resistance effect film 13 along the longitudinal direction of the wiring 14. This respect will be described with reference to FIG. 3.

Figure 3:
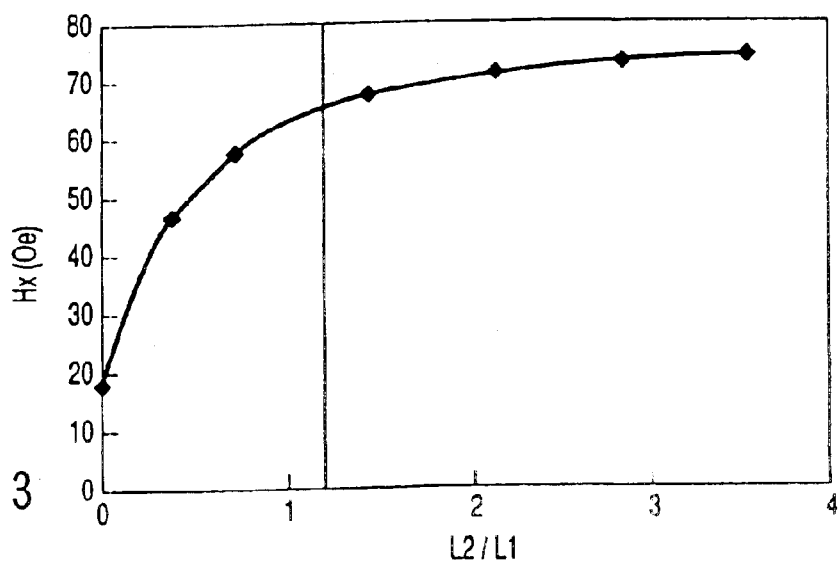
FIG. 3 is a graph showing a relation between a ratio $L_2/L_1$ of a magnetic film length $L_2$ to a magnetoresistance effect film length $L_1$ and a magnetic field strength $H_x$.

FIG. 3 is a graph showing a relation between a ratio $L_2/L_1$ of a length $L_2$ of the magnetic film 17 along the longitudinal direction of the wiring 14 to a length $L_1$ of the magnetoresistance effect film 13 along the longitudinal direction of the wiring 14, and a magnetic field strength $H_x$ in a position of the magnetic recording layer 23. Note that the graph is obtained by simulation. In FIG. 3, the abscissa denotes the ratio $L_2/L_1$, and the ordinate denotes the magnetic field strength $H_x$.

As shown in FIG. 3, when the ratio $L_2/L_1$ is larger, a higher magnetic field strength $H_x$ is obtained. Moreover, when the ratio $L_2/L_1$ increases to a certain degree, a rise of the magnetic field strength $H_x$ tends to be saturated. In order to more effectively apply the magnetic field to the magnetic recording layer 23, the ratio $L_2/L_1$ is preferably 1.2 or more, more preferably 1.5 or more. Similarly, a ratio $L_4/L_3$ of a length $L_4$ of the magnetic film 18 along the longitudinal direction of the wiring 15 to a length $L_3$ of the magnetoresistance effect film 13 along the longitudinal direction of the wiring 15 is preferably 1.2 or more, more preferably 1.5 or more. In this case, the magnetic field can more effectively be applied to the magnetic recording layer 23, and the effect of reducing the power consumption becomes more conspicuous.

The magnetic film 18 preferably contacts the tunnel barrier layer 24. However, if the magnetic film 18 is magnetically connected to the tunnel barrier layer 24, and magnetic connection of the magnetic film 18 to the magnetic recording layer 23 is thereby achieved, the magnetic film 18 may not contact the tunnel barrier layer 24. Such magnetic connection is realized when a distance between the magnetic film 18 and the tunnel barrier layer 24 is 0.1 μm or less, preferably 0.05 μm or less.

Moreover, since a writing time is as short as several nanoseconds (i.e., the memory is used at a high frequency), a skin depth δ is preferably a sub-micron or more. It is noted that the skin depth δ, specific resistance ρ, frequency ω, and permeability μ have a relation as represented by the following equation:

$$\delta = (2\rho/\omega\mu)^{1/2}$$

Therefore, the specific resistance of the high saturation magnetization soft magnetic material is preferably 20 μΩ·cm or more, and more preferably 50 μΩ·cm or more.

Each of the magnetic films 17, 18 containing the high saturation magnetization soft magnetic material can be constituted by an alloy film such as a Co—Fe alloy film and a Co—Fe—Ni alloy film; an amorphous material film such as a Co—(Zr, Hf, Nb, Ta, Ti) film and a (Co, Fe, Ni)—(Si, B)—(P, Al, Mo, Nb, Mn) based film; and a metal-nonmetal nano-granular film such as a (Fe, Co)—(B, Si, Hf, Zr, Sm, Ta, Al)—(F, O, N) based film. When these materials are used, and a ratio of constituting elements is appropriately adjusted, a magnetostriction can be set substantially to zero, and the softened magnetic films 17, 18 having a small coercive force can be obtained. Note that sectional shapes of the magnetic films 17, 18 are not limited to those shown in FIGS. 1A to 1D, and various modified shapes can be used.

A cobalt-based alloy containing cobalt as a main component is preferably used as the high saturation magnetization soft magnetic material contained in the magnetic films 17, 18, and a material containing copper as a main component for a high current density is preferably used as the material of the wirings 14, 15. In this case, these constituting materials can be prevented from being mutually diffused between the wirings 14, 15 and magnetic films 17, 18. Therefore, a thermal stability is enhanced, and a deterioration with an elapse of time can be suppressed.

The magnetization pinned layers 21, 25 may be constituted by ferromagnetic layers. The material constituting the ferromagnetic layer is not particularly limited as long as a ferromagnetic property is exhibited. Examples of the material include: metals such as Fe, Co and Ni; alloys of these metals; oxides such as a magnetite having a large spin polarization ratio ($Fe_3O_4$), $CrO_2$, and $RXMnO_{3-y}$ (R represents a rare earth element, and X represents at least one element of Ca, Ba, and Sr); and Heusler's alloys such as NiMnSb and PtMnSb. The ferromagnetic layer needs to be thick to such an extent that super-paramagnetism is not provided, and is preferably 0.4 nm thick or more.

It is preferable to laminate an antiferromagnetic film of Fe—Mn, Pt—Mn, Pt—Cr—Mn, Ni—Mn, Ir—Mn, NiO, and $Fe_2O_3$ on the ferromagnetic layer, and fix a magnetization direction. Moreover, a laminated film of the ferromagnetic and nonmagnetic layers may be used as the magnetization pinned layers 21, 25. When a three-layer film of a ferromagnetic layer/nonmagnetic layer/ferromagnetic layer is used as the laminated film, it is preferable to generate an antiferromagnetic interaction between the ferromagnetic layers via the nonmagnetic layer.

Particularly, in a structure in which an antiferromagnetic film made of Fe—Mn, Pt—Mn, Pt—Cr—Mn, Ni—Mn, Ir—Mn, NiO, and $Fe_2O_3$ is formed on the ferromagnetic film via laminated films such as Co(Co—Fe)/Ru/Co(Co—Fe) and Co(Co—Fe)/Ir/Co(Co—Fe), the magnetization direction of the magnetization pinned layers 21, 25 is hardly influenced by the current magnetic field. That is, the magnetization direction of the ferromagnetic layer can firmly be fixed.

A ratio L/W of a length L and width W of the magnetic recording layer 23 is preferably 1.5 or more, more preferably 2 or more. However, with the structure shown in FIGS. 1A to 1D, even when the ratio L/W is 1, a high density can be realized by a single magnetic domain. Moreover, uniaxial anisotropy is preferably imparted to the magnetic recording layer 23 in a length direction of the layer, and both ends of the layer in the length direction (a direction of magnetization easy axis) are preferably connected to the magnetic film 18 via the tunnel barrier layer 24.

The material for use in the magnetic recording layer 23 is not particularly limited as long as the ferromagnetic property is exhibited. Examples of the material include: metals such as Fe, Co and Ni; alloys of these metals; oxides such as a magnetite having a large spin polarization ratio ($Fe_3O_4$), $CrO_2$, and $RXMnO_{3-y}$ (R represents a rare earth element, and X represents at least one element of Ca, Ba, and Sr); and Heusler's alloys such as NiMnSb and PtMnSb. The ferromagnetic layer needs to be thick to such an extent that super-paramagnetism is not provided, and is preferably 0.4 nm thick or more.

The magnetic recording layer 23 may be of a single layer structure or a laminated structure. When the magnetic recording layer 23 has the laminated structure, for example, a two-layer film of a soft ferromagnetic layer/ferromagnetic layer or a three-layer film of a ferromagnetic layer/soft ferromagnetic-layer/ferromagnetic layer may be used.

Moreover, another structure can also be employed in which the magnetic recording layer 23 is a three-layer film of a ferromagnetic layer/nonmagnetic layer/ferromagnetic layer, and these ferromagnetic layers mutually interact in an antiferromagnetic or weakly ferromagnetic manner via the nonmagnetic layer. In this case, when the current magnetic field acts on the magnetic recording layer 23, an influence of stray field to the magnetization pinned layers 21, 25 from the magnetic recording layer 23 is eliminated. Additionally, even when a memory cell width is set to be a sub-micron or less, increase of power consumption necessary for generating a predetermined current magnetic field by diamagnetism can be suppressed. When this structure is employed, it is preferable that a softer layer is used in the ferromagnetic layer on a magnetic film 18 side, or the film thickness of the layer is set to be larger. Similarly as described above, a two-layer film of a soft ferromagnetic layer/ferromagnetic layer, or a three-layer film of a ferromagnetic layer/soft ferromagnetic layer/ferromagnetic layer can be used as the soft layer.

In addition to the aforementioned magnetic materials, the ferromagnetic layer for use in the magnetization pinned layers 21, 25 and magnetic recording layer 23 can contain nonmagnetic elements such as Ag, Cu, Au, Al, Mg, Si, Bi, Ta, B. C, O, N, Pd, Pt, Zr, Ir, W, Mo, and Nb in a range in which the ferromagnetic property is not lost. Moreover, the ferromagnetic layer for use in the magnetization pinned layers 21, 25 preferably has a unidirectional anisotropy parallel to the film surface, and the ferromagnetic layer for use in the magnetic recording layer 23 preferably has uniaxial anisotropy parallel to the film surface. The thickness of the ferromagnetic layer is preferably in a range of 0.1 nm to 100 nm, and is preferably smaller. When the magnetic memory 10 is prepared, the thickness of the ferromagnetic layer is preferably 10 nm or less.

As the material of the tunnel barrier layers 22, 24, dielectric materials or insulating materials such as $Al_2O_3$, AlN, MgO, $SiO_2$, MgO, $LaAlO_3$, $MgF_2$, $CaF_2$, $SrTiO_2$, and $AlLaO_3$ can be used. Omission of oxygen, nitrogen, or fluorine may exist in these materials.

The magnetic memory 10 can be formed on the substrate 20 in a surface region of which at least a part of the transistor 12, and the like are formed. The material of the substrate 20 is not especially limited, and Si, $SiO_2$, $Al_2O_3$, spinel, AlN, and the like can be used. Moreover, the magnetic memory 10 is preferably formed on the substrate via a protective layer or a underlayer. Examples of the material for use in the protective layer or the underlayer include Ta, Ti, Pt, Pd, Au, Ti/Pt, Ta/Pt, Ti/Pd, Ta/Pd, Cu, Al—Cu, W, and the like.

The magnetic memory 10 can be manufactured using usual thin film forming techniques such as various sputtering processes, evaporation process, and molecular beam epitaxy process.

Figure 4:
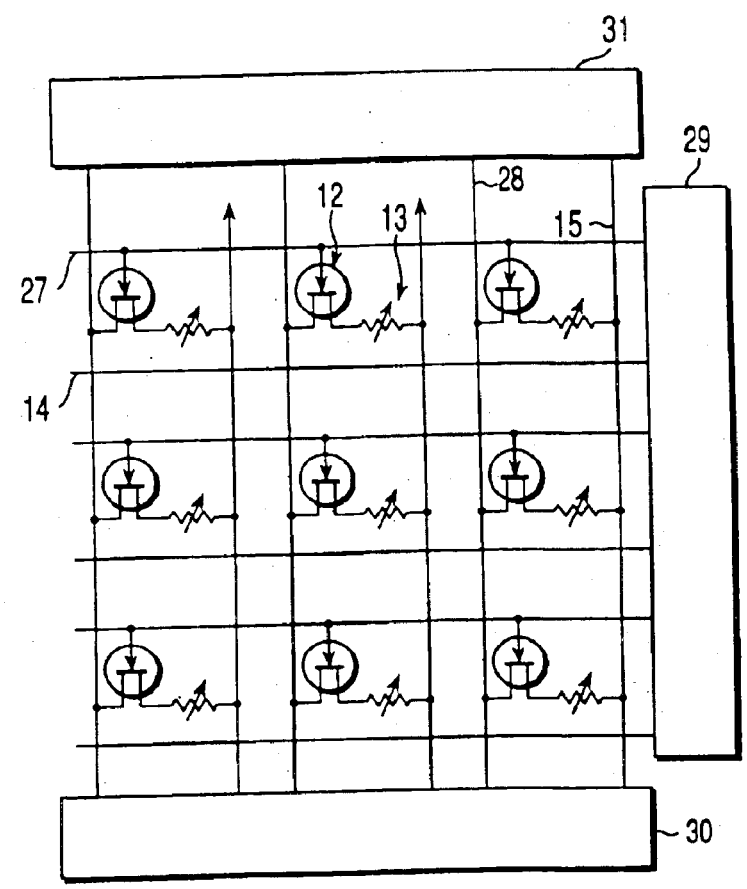
FIG. 4 is a circuit diagram showing one example of a circuit constitution of the magnetic memory according to the first embodiment of the present invention.

A circuit diagram of the aforementioned magnetic memory 10 is shown in FIG. 4.

FIG. 4 is a circuit diagram showing one example of a circuit constitution of the magnetic memory 10 according to the first embodiment of the present invention. In FIG. 4, the wiring 15 of the magnetic memory 10 shown in FIGS. 1A to 1D is used as a bit line, and the wiring 14 is used as a word line. Moreover, in FIG. 4, reference numeral 27 denotes a word line, 28 denotes a bit line, 29 denotes a row decoder, 30 denotes a column decoder, and 31 denotes a sense amplifier. The magnetic memory 10 shown in FIGS. 1A to 1D can take, for example, this circuit constitution.

Figure 5:
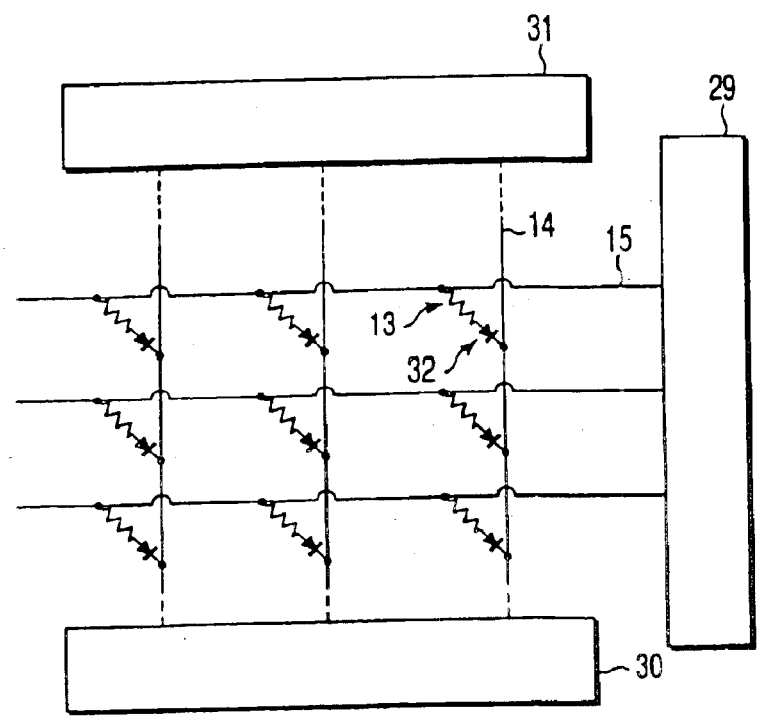
FIG. 5 is a circuit diagram showing another example of the circuit constitution of the magnetic memory according to the first embodiment of the present invention.

When the magnetic memory 11 shown in FIGS. 1A to 1D is used, the magnetic memory can be realized even with the circuit constitution shown in FIG. 5.

FIG. 5 is a circuit diagram showing another example of the circuit constitution of the magnetic memory 10 according to the first embodiment of the present invention. Moreover, FIG. 6 is a perspective view schematically showing one example of the structure of the magnetic memory 11 in which the circuit constitution shown in FIG. 5 is employed. As shown in FIGS. 5 and 6, the ferromagnetic double tunnel junction 13 and diode 32 are connected in series with each other, and are connected to an intersection of the word line 14 and bit line 15. This structure can also be employed.

A second embodiment of the present invention will next be described.

FIG. 7A is a sectional view schematically showing the magnetic memory according to the second embodiment of the present invention, and FIG. 7B is a partial sectional view taken along a line 7B—7B of the magnetic memory shown in FIG. 7A. Different from the magnetic memory 10 of the first embodiment, in the magnetic memory 10 of the second embodiment, the magnetic films 17, 18 are formed not only in the position of the ferromagnetic double tunnel junction 13 but also over the whole wirings 14, 15. When this structure is employed, the magnetic films 17, 18 are easily aligned with the ferromagnetic double tunnel junction 13.

A third embodiment of the present invention will next be described.

FIG. 8A is a sectional view schematically showing the magnetic memory according to the third embodiment of the present invention, and FIG. 8B is a partial sectional view taken along a line 8B—8B of the magnetic memory shown in FIG. 8A. Different from the magnetic memory 10 of the first embodiment, in the magnetic memory 10 according to the third embodiment, the magnetic film 17 is disposed not only below but also above the wiring 16. When the structure is employed, the current magnetic field from the wiring 14 can more efficiently act on the ferromagnetic double tunnel junction 13.

A fourth embodiment of the present invention will next be described.

FIG. 9A is a sectional view schematically showing the magnetic memory according to the fourth embodiment of the present invention, and FIG. 9B is a partial sectional view taken along a line 9B—9B of the magnetic memory shown in FIG. 9A. In the magnetic memory 10 according to the fourth embodiment, different from the magnetic memory 10 of the first embodiment, the magnetic films 17, 18 are formed not only in the position of the magnetic recording layer 23 but also over the whole wirings 14, 15. When the structure is employed, the magnetic films 17, 18 can easily be aligned with the ferromagnetic double tunnel junction 13. Moreover, in the magnetic memory 10 according to the fourth embodiment, different from the magnetic memory 10 of the first embodiment, the magnetic film 17 is formed not only below but also above the wiring 16. When the structure is employed, the current magnetic field from the wiring 14 can more efficiently act on the ferromagnetic double tunnel junction 13.

A fifth embodiment of the present invention will next be described.

FIG. 10 is a sectional view schematically showing a part of the magnetic memory according to the fifth embodiment of the present invention. In the magnetic memory 10 of the fifth embodiment, different from the magnetic memory 10 according to the first embodiment, the wiring 15 does not directly contact the magnetic film 18, and a dielectric film or an insulating film 19 is positioned between the wiring and the magnetic film. In this manner, the wiring 15 may electrically contact the magnetic film 18, or may not contact the film.

A sixth embodiment of the present invention will next be described.

FIG. 11 is a sectional view schematically showing a part of the magnetic memory according to the sixth embodiment of the present invention. In the magnetic memory 10 according to the first to fifth embodiments, the wiring 15 serving as both the current wiring and the bit line is used. On the other hand, in the magnetic memory 10 according to the sixth embodiment, a current wiring 33 and bit line 34 are provided independently from each other. When the aforementioned principle is utilized, the current magnetic field can efficiently act on the ferromagnetic double tunnel junction 13, and therefore this structure is also possible.

In the aforementioned first to sixth embodiments, the width of the magnetization pinned layer 25 is set to be smaller than the width of the magnetization pinned layer 21, tunnel barrier layer 22, magnetic recording layer 23, and tunnel barrier layer 24, the upper surfaces of the tunnel barrier layer 24 facing the sidewall parts of the magnetic film 18 are exposed, and the exposed surfaces are utilized to magnetically connect the magnetic film 18 to the magnetic recording layer 23. On the other hand, in the following seventh embodiment, all the magnetization pinned layer 21, tunnel barrier layer 22, magnetic recording layer 23, tunnel barrier layer 24, and magnetization pinned layer 25 are formed to have the same width.

FIG. 12 is a sectional view schematically showing a part of the magnetic memory according to the seventh embodiment of the present invention. In the magnetic memory 10 of the seventh embodiment, different from the magnetic memory 10 according to the first embodiment, all the magnetization pinned layer 21, tunnel barrier layer 22, magnetic recording layer 23, tunnel barrier layer 24, and magnetization pinned layer 25 are formed to have the same width. Therefore, in a method similar to that of the first to sixth embodiments, the magnetic film 18 cannot magnetically be connected to the magnetic recording layer 23.

To solve the problem, in the seventh embodiment, the opening width of the magnetic film 18 is set to be not less than the width of the ferromagnetic double tunnel junction 13. According to this structure, since the magnetization pinned layer 25 is not disposed between each end of the magnetic film 18 and the magnetic recording layer 23, the magnetic connection of the magnetic film 18 to the magnetic recording layer 23 is not inhibited by the magnetization pinned layer 25. Therefore, according to the seventh embodiment, the current magnetic field can efficiently act on the magnetic recording layer, and the power consumption required for writing the information can be reduced.

In the seventh embodiment, the distance between the opposite ends of the magnetic film 18 and the magnetic recording layer 23 is not especially limited as long as the magnetic connection of the magnetic film 18 to the magnetic recording layer 23 is achieved, but the closer distance is preferable. Usually, the distance between the opposite ends of the magnetic film 18 and the magnetic recording layer 23 is sufficiently 0.05 µm or less.

An eighth embodiment of the present invention will next be described.

FIG. 13A is a sectional view schematically showing the magnetic memory according to the eighth embodiment of the present invention, and FIG. 13B is a partial sectional view taken along a line 13B—13B of the magnetic memory shown in FIG. 13A. The magnetic memory 10 of the eighth embodiment is different from the magnetic memory 10 of the seventh embodiment in that the magnetic film 17 is formed not on a side surface of the wiring 14, but only on a bottom surface of the wiring.

When the CMOS transistor 12 is used as a sense current control device, and when the width of the ferromagnetic double tunnel junction 13 (size in a direction parallel to the bit line 15) is W, and length (size in a direction parallel to the word line 14) is L, the distance between the adjacent ferromagnetic double tunnel junctions 13 in the longitudinal direction of the wiring 14 is usually substantially the same as the width W. On the other hand, the distance between the ferromagnetic double tunnel junctions 13 adjacent to each other in the longitudinal direction of the wiring 15 is substantially three times the width W. That is, in the magnetic memory, the distance between the ferromagnetic double tunnel junctions 13 adjacent to each other is relatively short in the width direction, but sufficiently long in the length direction.

Therefore, the cross talk between the ferromagnetic double tunnel junctions 13 adjacent to each other in the longitudinal direction of the wiring 14 needs to be considered, but the cross talk between the ferromagnetic double tunnel junctions 13 adjacent to each other in the longitudinal direction of the wiring 15 does not necessarily have to be considered. Therefore, in this case, as shown in FIGS. 13A, 13B, the magnetic film 18 is formed on the side and bottom surfaces of the wiring 15, and the magnetic film 17 is not formed on the side surface of the wiring 14 but is formed only on the bottom surface; of the wiring. Then, the current magnetic field can efficiently act on the ferromagnetic double tunnel junction 13 without causing the cross talk.

In the magnetic memory shown in FIGS. 13A and 13B, in order to more efficiently allow the current magnetic field to act on the ferromagnetic double tunnel junction 13, structures shown in FIGS. 14A, 14B and FIGS. 15A to 15C may be employed.

FIGS. 14A and 14B are sectional views schematically showing a structure example of the wiring 14 and magnetic film 17 of the magnetic memory according to the eighth embodiment of the present invention. Moreover, FIGS. 15A to 15C are sectional views schematically showing the structure example of the wiring 15 and magnetic film 18 of the magnetic memory according to the eighth embodiment of the present invention.

In FIG. 14A and FIGS. 15A and 15C, a combination of the wiring 14 and the magnetic film 17, and a combination of the wiring 15 and the magnetic film 18 constitute two-layer structures. Moreover, in FIG. 14B and FIG. 15B, a combination of the wiring 14 and the magnetic film 17, and a combination of the wiring 15 and the magnetic film 18 constitute three-layer structures. When the combination of the wiring and the magnetic film constitutes a multiple-layer structure in this manner, as compared with the single-layer structure, the current magnetic field can more efficiently act on the ferromagnetic double tunnel junction 13.

In the aforementioned first to eighth embodiments, the reduction of the writing power consumption by the predetermined structure in the magnetic memory having the ferromagnetic double tunnel junction has been described. In the following ninth embodiment, when the magnetic film made of a predetermined material is used, the power consumption during writing of the magnetic memory having a ferromagnetic single tunnel junction is reduced.

FIG. 16 is a sectional view schematically showing a part of the magnetic memory according to the ninth embodiment of the present invention. The magnetic memory 10 of the ninth embodiment has a structure similar to that of the magnetic memory 10 of the first embodiment. That is, the magnetic memory 10 of the ninth embodiment has a ferromagnetic single tunnel junction 35 in which the magnetization pinned layer 21, tunnel barrier layer 22, and magnetic recording layer 23 are successively laminated. The bit line 34 is formed on the ferromagnetic single tunnel junction 35. The current wiring 33 coated with the magnetic film 18 is formed on the bit line 34 via the insulating film 19. It is noted that, below the ferromagnetic single tunnel junction 35, a wiring is disposed crossing at right angles to the current wiring 33 and bit line 34, and the magnetic film is also formed on such wiring.

In the ninth embodiment, the magnetic film 18 is constituted by the high saturation magnetization soft magnetic material film containing a Co element or the metal-nonmetal nano-granular film. When this thin film is used, the power consumption necessary for writing the information into the magnetic recording layer 23 can be reduced.

Examples of the high saturation magnetization soft magnetic material film containing the Co element and constituting the magnetic film 18 include: alloy film such as a Co—Fe alloy film and Co—Fe—Ni alloy film; and amorphous material film such as a Co—(Zr, Hf, Nb, Ta, Ti) film and a (Co, Fe, Ni)—(Si, B)—(P, Al, Mo, Nb, Mn) based film. Moreover, examples of the metal-nonmetal nano-granular film constituting the magnetic film 18 include: a (Fe, Co)—(B, Si, Hf, Zr, Sm, Ta, Al)—(F, O, N) based metal-nonmetal nano-granular film. When these materials are used, and the ratio of the constituting elements is appropriately adjusted, the magnetostriction can be set substantially to zero, and the softened magnetic film 18 having a small coercive force can be obtained.

In the ninth embodiment, the reduction of the power consumption for writing the information into the magnetic memory having the ferromagnetic single tunnel junction by the magnetic film made of the predetermined material has been described. However, with the material, the writing power consumption can of course be reduced even in the magnetic memory having the ferromagnetic double tunnel junction. Moreover, in the first to ninth embodiments, the magnetic films are formed on both the pair of wirings intersecting each other via the ferromagnetic tunnel junction, but the magnetic film may be formed on only one of the wirings. In this case, the power consumption on writing can also be reduced.

Examples of the present invention will be described hereinafter.

EXAMPLE 1

The magnetic memory 10 shown in FIG. 16 was formed in the following method.

First, a Ta underlayer and a 50 nm thick Cu layer were successively laminated on an Si/SiO$_2$ substrate (not shown). Subsequently, successively formed on the Cu layer were a composite film for use as the magnetization pinned layer 21 of a 2 nm thick Ni$_{81}$Fe$_{19}$ layer, 12 nm thick Ir$_{22}$Mn$_{78}$ layer, and 3 nm thick CO$_{50}$Fe$_{50}$ layer; a 1 nm thick Al$_2$O$_3$ layer for use as the tunnel barrier layer 22; a composite film for use as the magnetic recording layer 23 of a 3 nm thick CO$_{50}$Fe$_{50}$ layer and 5 nm thick Ta layer; and an Au layer for use as the protective film (not shown).

It is noted that a sputtering process or an evaporation process was used in forming these thin films, and an initial vacuum degree was 3×10$^{-8}$ Torr. Moreover, the Al$_2$O$_3$ layer was formed by using Al target as a sputtering target, and introducing a pure Ar gas as a sputtering gas to form the film in vacuum, and exposing the Al film to plasma oxygen. In this method, the thin Al$_2$O$_3$ layer was formed without any omission of oxygen.

Subsequently, the laminated film (including the Au layer to the Ni$_{81}$Fe$_{19}$ layer on the Cu layer) formed by the aforementioned method was patterned in a size of 4 μm×16 μm using photolithography and ion milling techniques. The ferromagnetic tunnel junction 35 was formed as described above.

Subsequently, while the resist pattern utilized in the patterning was left as it was, the 250 nm thick Al$_2$O$_3$ layer was formed as the interlayer insulating film 19 by an electron beam evaporation. Thereafter, the resist pattern was lifted off, and a resist pattern was further formed in order to form the wiring 34. After the surface was cleaned by sputtering, the Cu wiring 34 was formed.

Subsequently, the 250 nm thick interlayer insulating film 19 of SiO$_2$ was formed by a reactive sputtering process, and the Au wiring 33 was formed by lifted-off process. Thereafter, the high saturation magnetization soft magnetic material was sputtered, the resulting thin film was patterned in the ion milling process, and the magnetic film 18 was obtained. As described above, the magnetic memory 10 shown in FIG. 16 was formed and thereafter treated in a heat treatment furnace in the magnetic field. As a result, the uniaxial anisotropy was imparted to the magnetic recording layer 23 and the unidirectional anisotropy was imparted to the magnetization pinned layer 21.

It is noted that a plurality of types of magnetic memories 10 were manufactured using materials shown in the following table 1 as the high saturation magnetization soft magnetic material. Moreover, for comparison, a magnetic memory with no magnetic film 18 formed thereon, and a magnetic memory using a high permeability material Ni—Fe in the magnetic film 18 were also manufactured.

The power consumption of the magnetic memory 10 manufactured in the aforementioned method was measured in the following method. That is, when a current pulse of 10 nsec was passed through the wiring 33, the current magnetic field was exerted onto the magnetic recording layer 23 in the easy axis direction 26. Moreover, in a magnetically hard axis direction, a magnetic field of 20 Oe was exerted using a Helmholtz coil. A current value of current pulse was gradually increased, and a current Ic at which the magnetization of the magnetic recording layer 23 was reversed was recorded. It is noted that, whether or not the magnetization of the magnetic recording layer 23 was reversed was judged by passing a direct current through the ferromagnetic single tunnel junction 35 and observing a change of output voltage. Results are also shown in the following table 1.

TABLE 1

| Material of magnetic film | Ic(mA) |
| --- | --- |
| Co$_{90}$Fe$_{10}$ | 16 |
| Co$_{60}$Fe$_{20}$Ni$_{20}$ | 14 |
| Co$_{30}$Fe$_{30}$Ni$_{40}$ | 15 |
| Co$_{70.3}$Fe$_{4.7}$Si$_{15}$B$_{10}$ | 13 |
| Co$_{75.3}$Fe$_{4.7}$Si$_4$B$_{16}$ | 13 |
| Co$_{69.6}$Fe$_{4.6}$Mo$_{1.8}$Si$_8$B$_{15}$ | 13 |
| Co$_{70}$Mn$_6$B$_{24}$ | 14 |
| Co$_{81.5}$Mo$_{9.5}$Zr$_9$ | 15 |
| Co$_{96}$Zr$_4$ | 13 |
| Co$_{87}$Nb$_5$Zr$_8$ | 14 |
| Co$_{85}$Nb$_{7.5}$Ti$_{7.5}$ | 14 |
| Co$_{90}$Fe$_2$Nb$_8$ | 13 |
| Co$_{60}$Al$_{10}$O$_{34}$ | 14 |
| Fe$_{58}$V$_{13}$O$_{29}$ | 16 |
| Fe$_{49}$Al$_{17}$O$_{34}$ | 16 |
| Fe$_{40}$B$_{25}$N$_{35}$ | 15 |
| Fe$_{59}$Sm$_{17}$O$_{24}$ | 17 |
| absent | 45 |
| Ni$_{81}$Fe$_{19}$ | 22 |
| Ni$_{60}$Fe$_{40}$ | 20 |

As shown in the above table 1, in the magnetic memory 10 of the present example, as compared with the apparatus having no magnetic film 18, Ic is of course low. Even as compared with the use of the high permeability material Ni—Fe in the magnetic film 18, a lower Ic was obtained. That is, it was confirmed that the writing power consumption was reduced in the magnetic memory 10 of the present example.

Moreover, a similar test was carried out for the magnetic memory 10 having the ferromagnetic double tunnel junction 13. As a result, a similar tendency was found as described above.

EXAMPLE 2

The magnetic memory 10 shown in FIGS. 1A to 1D was formed in the following method.

First, an $SiO_2$ film was formed on the $Si/SiO_2$ substrate using a plasma CVD process. Subsequently, a damascene process was used to form the magnetic film 17 and wiring 14 on the $SiO_2$ film.

That is, a stepper was used to form a rectangular recessed portion in the $SiO_2$ film. Subsequently, the sidewall and bottom surface of the recessed portion were coated by an $Ni_{40}Fe_{60}$ film sputtered as the high saturation magnetization soft magnetic material. Subsequently, the recessed portion was filled with Cu by a plating process. Thereafter, the CMP method was used to remove the high saturation magnetization soft magnetic material film and Cu film positioned outside the recessed portion, and the magnetic film 17 and wiring 14 were formed.

Subsequently, a 250 nm interlayer insulating film of $SiO_2$ was formed on the surface of the $Si/SiO_2$ substrate with the magnetic film 17 and wiring 14 formed thereon by the plasma CVD process. A Ta/W/Ta underlayer and 50 nm thick Cu layer were successively laminated on the interlayer insulating film (no shown). Subsequently, successively formed on the Cu layer were a composite film for use as the magnetization pinned layer 21 of a 2 nm thick $Ni_{81}Fe_{19}$ layer, 12 nm thick $Ir_{22}Mn_{78}$ layer, and 3 nm thick $CO_{50}Fe_{50}$ layer; a 1 nm thick $Al_2O_3$ layer for use as the tunnel barrier layer 22; a composite film for use as the magnetic recording layer 23 of a 2 nm thick $CO_{50}Fe_{50}$ layer and 5 nm thick $Ni_{81}Fe_{19}$ layer; a 1.2 nm thick $Al_2O_3$ layer for use as the tunnel barrier layer 24; a composite film for use as the magnetization pinned layer 25 of a 3 nm thick $CO_{50}Fe_{50}$ layer, 12 nm thick $Ir_{22}Mn_{78}$ layer, and 5 nm thick Ta layer; and an Au layer for use as the protective film (not shown).

It is noted that the sputtering process or the evaporation process was used in forming these thin films, and the initial vacuum degree was $3\times10^{-8}$ Torr. Moreover, the $Al_2O_3$ layer was formed in a method similar to that of the Example 1.

Subsequently, the stepper was used to pattern the laminated film (including the Au layer to the $Ni_{81}Fe_{19}$ layer on the Cu layer) formed in the aforementioned method in a size of 0.8 μm×4 μm. The ferromagnetic tunnel junction 35 was formed in this manner.

Subsequently, a hard mask of $SiO_2$ and $Si_3N_4$ able to be mutually etched was used to pattern the composite film for use as the magnetization pinned layer 25 of the $CO_{50}Fe_{50}$ layer, $Ir_{22}Mn_{78}$ layer and $Ni_{81}Fe_{19}$ layer, and the Au layer for use as the protective film in a size of 0.8 μm×2 μm.

Thereafter, the interlayer insulating film 19 of $SiO_2$ was formed by the plasma CVD process, the surface of the film was flatted by the CMP process, and the upper surface of the $Si_3N_4$ pattern was exposed. Note that the thickness of the $SiO_2$ interlayer insulating film 19 after the CMP process was set to 250 nm. Subsequently, $Si_3N_4$ pattern was removed by the RIE process, the concave portion was formed, and the Cu wiring 15 was formed in the concave portion.

Subsequently, the $Si_3N_4$ pattern was formed as the hard mask on the $SiO_2$ interlayer insulating film 19, and a trench for the magnetic film 18 was formed in the $SiO_2$ interlayer insulating film 19 by the RIE process. Subsequently, a trench structure whose bottom surface was constituted by the tunnel barrier layer 24 was formed. Subsequently, the $Si_3N_4$ pattern was removed by the RIE process, and the exposed surfaces were plasma-oxidized in order to prevent a short circuit between the magnetic film 18 and the magnetic recording layer 23 and wiring 15. Thereafter, a sputtering apparatus having a high directivity was used to sputter $Ni_{40}Fe_{60}$ as the high saturation magnetization soft magnetic material so that the trench formed in the aforementioned method was filled, the obtained thin film was patterned-using the ion milling technique, and the magnetic film 18 was formed.

As described above, the magnetic memory 10 shown in FIGS. 1A to 1D was manufactured, and treated in the magnetic field in the heat treatment furnace. Thereby, the uniaxial anisotropy was imparted to the magnetic recording layer 23, and the unidirectional anisotropy was imparted to the magnetization pinned layers 21, 25.

It is noted that the magnetic memory 10 shown in FIGS. 1A to 1D was formed in a similar method except that the magnetic film 17 was not formed. It is also noted that, for comparison, a magnetic memory in which the structure shown in FIG. 11 was used in the magnetic film 17, ferromagnetic double tunnel junction 13, and magnetic film 18, and a magnetic memory in which the structure shown in FIG. 12 was used in the ferromagnetic double tunnel junction 13 and magnetic film 18 without forming the magnetic film 17 were prepared. In these comparative magnetic memories, the distance between the magnetic films 17, 18 and the magnetic recording layer 23 was set to 0.15 μm.

The power consumption was measured with respect to the respective magnetic memories 10 in the following method. That is, a current pulse of 10 nsec was passed through each of the wirings 14, 15, and the current magnetic fields were exerted onto the magnetic recording layer 23 in a direction of the magnetization easy axis 26 and in a direction of the magnetization hard axis. It is noted that the current value of the current pulse passed through the wiring 14 was set to 5 mA. It is also noted that the current value of the current pulse passed through the wiring 15 was gradually increased, and the current Ic at which the magnetization of the magnetic recording layer 23 was reversed was recorded. Additionally, whether or not the magnetization of the magnetic recording layer 23 was reversed was judged by writing the information, passing the direct current through the ferromagnetic double tunnel junction 13 and observing the output voltage change. Results are shown in the following table 2.

TABLE 2

| Structure of magnetic storage device | Magnetic film 17 | Ic(mA) |
| --- | --- | --- |
| FIGS. 1A–1D | Present | 3.5 |
| FIGS. 1A–1D | Absent | 5.1 |
| FIG. 12 | Present | 17.5 |
| FIG. 12 | Absent | 19 |

As shown in the above table 2, it was confirmed that in the magnetic memory 10 of the present example having the trench structure (with the structure shown in FIGS. 1A to 1D), as compared with the magnetic memory 10 having no trench structure (having the structure shown in FIG. 12) and having a long distance between the magnetic films 17, 18 and the magnetic recording layer 23, Ic was low, and the power consumption for writing was reduced. Moreover, it was confirmed that in the magnetic memory 10 including the magnetic film 17 and having an increasing magnetic field to be exerted in the magnetically hard axis direction, as compared with the magnetic memory 10 including no magnetic film 17, Ic of the magnetically easy axis direction 26 was small, and the power consumption for writing was further reduced.

EXAMPLE 3

The magnetic memory 10 shown in FIGS. 1A to 1D was prepared in a method similar to the method of Example 2 except that the ferromagnetic double tunnel junction 13 was constituted as shown in the following tables 3 and 4 and the materials shown in the following tables 3 and 4 were used in the magnetic films 17, 18. The power consumption was measured with respect to the magnetic memory 10 prepared as described above in a similar method except that the current value of the current pulse passed through the wiring 14 was set to 3 mA. Results are also shown in the tables 3 and 4.

further reduced. Moreover, it has also been seen that when the three-layer film of the ferromagnetic layer/nonmagnetic layer/ferromagnetic layer was used, and an antiferromagnetic interaction was exerted between the ferromagnetic layers via the nonmagnetic layer, Ic did not increase, and the power consumption was further reduced.

As described above, in the present invention, since the magnetic film is made of the predetermined material, the power consumption necessary for writing the information into the magnetic memory can be reduced. Moreover, since the magnetic film is used and the predetermined structure is employed in the present invention, the power consumption necessary for writing the information can also be reduced even in the magnetic memory having the ferromagnetic double tunnel junction.

That is, according to the present invention, there is provided a magnetic memory in which power consumption on writing is reduced.

Additional advantages and modifications will readily occur to those skilled in the art. Therefore, the invention in

TABLE 3

| Structure of ferromagnetic double tunnel junction | Material of magnetic film | Ic (mA) |
|---|---|---|
| PtMn/Co$_9$Fe/AlN/Fe$_{55}$Co$_{45}$/AlN/Co$_8$FeNi/PtMn (17 nm/3 nm/2 nm/5 nm/2.6 nm/3 nm/19 nm) | Co$_{90}$Fe$_{10}$ | 2.5 |
| | Co$_{70.3}$Fe$_{4.7}$Si$_{15}$B$_{10}$ | 2.1 |
| | Co$_{90}$Fe$_2$Nb$_8$ | 2.2 |
| Ir$_{22}$Mn$_{78}$/CoFe/Al$_2$O$_3$/Fe$_{10}$Co$_{90}$/Al$_2$O$_3$/CoFe/Ir$_{22}$Mn$_{78}$ (15 nm/3 nm/1.2 nm/3 nm/1.4 nm/5 nm/20 nm) | Co$_{30}$Fe$_{30}$Ni$_{40}$ | 2 |
| | Co$_{69.6}$Fe$_{4.6}$Mo$_{1.8}$Si$_8$B$_1$ | 1.9 |
| | Co$_{60}$Al$_{10}$O$_{34}$ | 2.1 |
| NiMn/CoFe/SiO$_2$/CoFe/Ni$_{81}$Fe$_{19}$/CoFe/SiO$_2$/CoFe/NiMn (19 nm/3 nm/1.8 nm/2 nm/4 nm/2 nm/2 nm/5 nm/20 nm) | Co$_{90}$Fe$_{10}$ | 2 |
| | Co$_{69.6}$Fe$_{4.6}$Mo$_{1.8}$Si$_8$B$_1$ | 2 |
| | Fe$_{49}$Al$_{17}$O$_{34}$ | 2.1 |
| Ir$_{22}$Mn$_{78}$/CoFeNi/Al$_2$O$_3$/FeCo$_2$Ni/Al$_2$O$_3$/CoFeNi/Ir$_{22}$Mn$_{78}$ (15 nm/2 nm/1.0 nm/5 nm/1.2 nm/3 nm/17 nm) | Co$_{60}$Fe$_{20}$Ni$_{20}$ | 2.4 |
| | Co$_{70.3}$Fe$_{4.7}$Si$_{15}$B$_{10}$ | 2.2 |
| | Co$_{85}$Nb$_{7.5}$Ti$_{7.5}$ | 2.1 |
| Ir$_{22}$Mn$_{78}$/CoFeNi/Al$_2$O$_3$/FeCo/Ni$_{81}$Fe$_{19}$/FeCo/Al$_2$O$_3$/CoFeNi/Ir$_{22}$Mn$_{78}$ (15 nm/2 nm/1.0 nm/3 nm/5 nm/3 nm/1.2 nm/3 nm/17 nm) | Co$_{90}$Fe$_{10}$ | 2 |
| | Co$_{75.3}$Fe$_{4.7}$Si$_4$B$_{16}$ | 1.9 |
| | Co$_{90}$Fe$_2$Nb$_8$ | 1.9 |
| Ir$_{22}$Mn$_{78}$/CoFe/Al$_2$O$_3$/FeCo/Ru/Fe$_3$Co$_7$/Al$_2$O$_3$/CoFe/Ir$_{22}$Mn$_{78}$ (15 nm/2 nm/1.0 nm/3 nm/0.7 nm/5 nm/1.2 nm/3 nm/17 nm) | Co$_{60}$Fe$_{20}$Ni$_{20}$ | 1.8 |
| | Co$_{96}$Zr$_4$ | 1.7 |
| | Fe$_{40}$B$_{25}$N$_{35}$ | 1.7 |

TABLE 4

| Structure of ferromagnetic double tunnel junction | Material of magnetic film | Ic (mA) |
|---|---|---|
| Ir$_{22}$Mn$_{78}$/CoFe/Ir/FeCo/Al$_2$O$_3$/FeCo/Ir/Fe$_3$Co$_7$/Al$_2$O$_3$/CoFe/Ir/FeCo/Ir$_{22}$Mn$_{78}$ (15 nm/2 nm/0.8 nm/3 nm/1.0 nm/3 nm/0.8 nm/3 nm/1.2 nm/3 nm/0.8 nm/17 nm) | Co$_{90}$Fe$_{10}$ | 1.6 |
| | Co$_{70.3}$Fe$_{4.7}$Si$_{15}$B$_{10}$ | 1.5 |
| | Co$_{85}$Nb$_{7.5}$Ti$_{7.5}$ | 1.5 |
| Ir$_{22}$Mn$_{78}$/CoFe/Ru/FeCo/Al$_2$O$_3$/Fe$_9$Co/Ru/Fe$_9$Co/Al$_2$O$_3$/CoFe/Ru/FeCo/Ir$_{22}$Mn$_{78}$ (15 nm/2 nm/0.7 nm/3 nm/1.0 nm/3 nm/0.7 nm/5 nm/1.2 nm/3 nm/0.7 nm/3 nm/17 nm) | Co$_{30}$Fe$_{30}$Ni$_{40}$ | 1.7 |
| | Co$_{69.6}$Fe$_{4.6}$Mo$_{1.8}$Si$_8$B$_{15}$ | 1.5 |
| | Fe$_{49}$Al$_{17}$O$_{34}$ | 1.9 |
| Ir$_{22}$Mn$_{78}$/CoFe/Ru/FeCo/Al$_2$O$_3$/FeCo/Ni$_8$Fe$_2$/CoFe/Ru/FeCo/Ni$_8$Fe$_2$/CoFe/Al$_2$O$_3$/CoFe/Ru/FeCo/Ir$_{22}$Mn$_{78}$ (12 nm/2 nm/0.7 nm/2 nm/1.0 nm/2 nm/2 nm/0.7 nm/2 nm/4 nm/2 nm/1.2 nm/3 nm/0.7 nm/3 nm/12 nm) | Co$_{30}$Fe$_{30}$Ni$_{40}$ | 1.8 |
| | Co$_{70}$Mn$_6$B$_{24}$ | 1.6 |
| | Co$_{60}$Al$_{10}$O$_{34}$ | 1.7 |
| PtMn/CoFe/Ru/FeCo/Al$_2$O$_3$/FeCo/Ni$_8$Fe$_2$/CoFe/Ru/FeCo/Ni$_8$Fe$_2$/CoFe/Al$_2$O$_3$/CoFe/Ru/FeCo/PtMn (15 nm/2 nm/0.7 nm/2 nm/1.0 nm/2 nm/2 nm/0.7 nm/2 nm/5 nm/2 nm/1.2 nm/3 nm/0.7 nm/3 nm/17 nm) | Co$_{90}$Fe$_{10}$ | 1.4 |
| | Co$_{75.3}$Fe$_{4.7}$Si$_4$B$_{16}$ | 1.3 |
| | Fe$_{40}$B$_{25}$N$_{35}$ | 1.4 |
| Ir$_{22}$Mn$_{78}$/CoFe/Ru/FeCo/Al$_2$O$_3$/FeCo/Ni$_4$Fe$_6$/CoFe/Ru/FeCo/Ni$_4$Fe$_6$/CoFe/Al$_2$O$_3$/CoFe/Ru/FeCo/Ir$_{22}$Mn$_{78}$ (15 nm/2 nm/0.7 nm/2 nm/1.0 nm/2 nm/3 nm/2 nm/2 nm/0.7 nm/2 nm/4 nm/2 nm/1.2 nm/3 nm/0.7 nm/3 nm/17 nm) | Co$_{60}$Fe$_{20}$Ni$_{20}$ | 1.4 |
| | Co$_{96}$Zr$_4$ | 1.3 |
| | Co$_{85}$Nb$_{7.5}$Ti$_{7.5}$ | 1.2 |

As shown in the above Tables 3 and 4, Ic was sufficiently low in any case, but when the magnetic films 17, 18 were constituted by the high saturation magnetization soft magnetic material film containing the Co element and metal-nonmetal nano-granular film, Ic was especially low, and it has also been seen that the writing power consumption was its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory comprising:
   first and second wirings intersecting each other and positioned apart from each other;
   a magnetoresistance effect film positioned between the first and second wirings and comprising,
      a magnetic recording layer configured to reverse a magnetization direction thereof by passing writing currents through the first and second wirings,
      a first magnetization pinned layer positioned between the first wiring and the magnetic recording layer and configured to hold magnetization direction thereof when passing the writing currents through the first and second wirings, and
      a first nonmagnetic layer intervening between the magnetic recording layer and the first magnetization pinned layer; and
   a first magnetic film covering a back surface and side surfaces of the first wiring, the back surface being opposite to a front surface of the first wiring that faces the magnetoresistance effect film, wherein each portion of the first magnetic film that covers the side surface of the first wiring extends across a plane including the front surface with an insulating film interposed between the magnetic recording layer and the portion of the first magnetic film covering the side surface of the first wiring.

2. The memory according to claim 1, wherein the first magnetic film further covers side surfaces of the first magnetization pinned layer with the insulating film interposed therebetween.

3. The memory according to claim 1, wherein the first magnetic film further covers side surfaces of the magnetic recording layer with the insulating film interposed therebetween.

4. The memory according to claim 1, wherein the magnetoresistance effect film further comprises,
   a second magnetization pinned layer configured to hold a magnetization direction thereof when passing the writing currents through the first and second wirings, the first and second magnetization pinned layers sandwiching the magnetic recording layer and the first nonmagnetic layer, and
   a second nonmagnetic layer intervening between the magnetic recording layer and the second magnetization pinned layer.

5. The memory according to claim 1, further comprising a second magnetic film covering a back surface and side surfaces of the second wiring, the back surface of the second wiring being opposite to a front surface of the second wiring that faces the magnetoresistance effect film.

6. The memory according to claim 1, wherein a length of the first magnetic film along a longitudinal direction of the first wiring is 1.2 times or more a length of the magnetoresistance effect film along the longitudinal direction of the first wiring.

7. The memory according to claim 1, wherein the first magnetic film comprises either a high saturation magnetization soft magnetic material containing cobalt or a metal-nonmetal nano-granular film.

8. The memory according to claim 7, wherein the first magnetic film comprises a high permeable magnetic material as the high saturation magnetization soft magnetic material, the high permeable magnetic material is an alloy containing cobalt or cobalt-iron as a main component, and the first and second wirings contain one material selected from the group consisting of copper, tungsten, and an alloy of copper and tungsten.

9. The memory according to claim 7, wherein the first magnetic film comprises a high permeable magnetic material as the high saturation magnetization soft magnetic material, the high permeable magnetic material is an alloy containing cobalt or cobalt-iron as a main component, and each of the first and second wirings has a multilayered structure including a nonmagnetic layer and a high saturation magnetization soft magnetic material layer.

10. The memory according to claim 7, wherein the first magnetic film comprises at least one film selected from the group consisting of a Co—Fe alloy film, a Co—Fe—Ni alloy film, a Co-(Zr, Hf, Nb, Ta, Ti) film, an amorphous film of these films, and a metal-nonmetal nano-granular film.

11. The memory according to claim 1, wherein the nonmagnetic layer is a nonmagnetic tunnel layer.

12. The memory according to claim 1, further comprising a sense current control element configured to control a sense current to be passed through the magnetic memory.

13. A magnetic memory comprising:
   first and second wirings intersecting each other and positioned apart from each other;
   a magnetoresistance effect film positioned between the first and second wirings and comprising,
      a magnetic recording layer configured to reverse a magnetization direction thereof by passing writing currents through the first and second wirings,
      a first magnetization pinned layer positioned between the first wiring and the magnetic recording layer and configured to hold a magnetization direction thereof when passing the writing currents through the first and second wirings, the first magnetization pinned layer being narrower in a width direction of the first wiring than the magnetic recording layer, and
      a first non-magnetic layer intervening between the magnetic recording layer and the first magnetization pinned layer, the first nonmagnetic layer being wider in the width direction than the first magnetization pinned layer; and
   a first magnetic film covering a back surface and side surfaces of the first wiring, the back surface being opposite to a front surface of the first wiring that faces the magnetoresistance effect film, wherein the magnetic recording layer is wider in the width direction than the first wiring, and each portion of the first magnetic film that covers the side surface of the first wiring is in contact with a surface of the first nonmagnetic layer on the side of the first magnetization pinned layer.

14. The memory according to claim 13, wherein the magnetoresistance effect film further comprises,
   a second magnetization pinned layer configured to hold a magnetization direction thereof when passing the writing currents through the first and second wirings, the first and second magnetization pinned layers sandwiching the magnetic recording layer and the first nonmagnetic layer, and
   a second nonmagnetic layer intervening between the magnetic recording layer and the second magnetization pinned layer.

15. The memory according to claim 13, further comprising a second magnetic film covering a back surface and side surfaces of the second wiring, the back surface of the second wiring being opposite to a front surface of the second wiring that faces the magnetoresistance effect film.

16. The memory according to claim 13, wherein a length of the first magnetic film along a longitudinal direction of the first wiring is 1.2 times or more a length of the magnetoresistance effect film along the longitudinal direction of the first wiring.

17. The memory according to claim 13, wherein the first magnetic film comprises a high saturation magnetization soft magnetic material containing cobalt or a metal-nonmetal nano-granular film.

18. The memory according to claim 17, wherein the first magnetic film comprises a high permeable magnetic material as the high saturation magnetization soft magnetic material, the high permeable magnetic material is an alloy containing cobalt or cobalt-iron as a main component, and the first and second wirings contain one material selected from the group consisting of copper, tungsten, and an alloy of copper and tungsten.

19. The memory according to claim 17, wherein the first magnetic film comprises a high permeable magnetic material as the high saturation magnetization soft magnetic material, the high permeable magnetic material is an alloy containing cobalt or cobalt-iron as a main component, and each of the first and second wirings has a multilayered structure including a nonmagnetic layer and a high saturation magnetization soft magnetic material layer.

20. The memory according to claim 17, wherein the first magnetic film comprises at least one film selected from the group consisting of a Co—Fe alloy film, a Co—Fe—Ni alloy film, a Co-(Zr, Hf, Nb, Ta, Ti) film, an amorphous film of these films, and a metal-nonmetal nano-granular film.

21. The memory according to claim 13, wherein the nonmagnetic layer is a nonmagnetic tunnel layer.

22. The memory according to claim 13, further comprising a sense current control element configured to control a sense current to be passed through the magnetic memory.

23. A magnetic memory comprising:
first and second wirings intersecting each other and positioned apart from each other;
a magnetoresistance effect film positioned between the first and second wirings and comprising,
a magnetic recording layer configured to reverse a magnetization direction thereof by passing writing currents through the first and second wirings, between a first direction and a second direction different from the first direction,
a first magnetization pinned layer positioned between the first wiring and the magnetic recording layer and configured to hold a magnetization direction thereof when passing the writing currents through the first and second wirings, the first magnetization pinned layer being narrower in a width direction of the first wiring than the magnetic recording layer, and
a first nonmagnetic layer intervening between the magnetic recording layer and the first magnetization pinned layer; and
a first magnetic film covering a back surface and side surfaces of the first wiring, the back surface being opposite to a front surface of the first wiring that faces the magnetoresistance effect film, wherein the magnetic recording layer is wider in the width direction than the first wiring, an oxide layer is formed on a portion of a surface of the magnetic recording layer that faces the front surface, the portion is not covered with the first magnetization pinned layer, and each portion of the first magnetic film that covers the side surface of the first wiring is in contact with the magnetic recording layer via the oxide layer.

24. The memory according to claim 23, wherein the magnetoresistance effect film further comprises,
a second magnetization pinned layer configured to hold a magnetization direction thereof when passing the writing currents through the first and second wirings, the first and second magnetization pinned layers sandwiching the magnetic recording layer and the first nonmagnetic layer, and
a second nonmagnetic layer intervening between the magnetic recording layer and the second magnetization pinned layer.

25. The memory according to claim 23, further comprising a second magnetic film covering a back surface and side surfaces of the second wiring, the back surface of the second wiring being opposite to a front surface of the second wiring that faces the magnetoresistance effect film.

26. The memory according to claim 23, wherein a length of the first magnetic film along a longitudinal direction of the first wiring is 1.2 times or more a length of the magnetoresistance effect film along the longitudinal direction of the first wiring.

27. The memory according to claim 23, wherein the first magnetic film comprises a high saturation magnetization soft magnetic material containing cobalt or a metal-nonmetal nano-granular film.

28. The memory according to claim 27, wherein the first magnetic film comprises a high permeable magnetic material as the high saturation magnetization soft magnetic material, the high permeable magnetic material is an alloy containing cobalt or cobalt-iron as a main component, and the first and second wirings contain one material selected from the group consisting of copper, tungsten, and an alloy of copper and tungsten.

29. The memory according to claim 27, wherein the first magnetic film comprises a high permeable magnetic material as the high saturation magnetization soft magnetic material, the high permeable magnetic material is an alloy containing cobalt or cobalt-iron as a main component, and each of the first and second wirings has a multilayered structure including a nonmagnetic layer and a high saturation magnetization soft magnetic material layer.

30. The memory according to claim 27, wherein the first magnetic film comprises at least one film selected from the group consisting of a Co—Fe alloy film, a Co—Fe—Ni alloy film, a Co-(Zr, Hf, Nb, Ta, Ti) film, an amorphous film of these films, and a metal-nonmetal nano-granular film.

31. The memory according to claim 23, wherein the nonmagnetic layer is a nonmagnetic tunnel layer.

32. The memory according to claim 23, further comprising a sense current control element configured to control a sense current to be passed through the magnetic memory.

33. A magnetic memory comprising:
first and second wirings intersecting each other and positioned apart from each other;
a magnetoresistance effect film positioned between the first and second wirings and comprising,
a magnetic recording layer configured to reverse a magnetization direction thereof by passing writing currents through the first and second wirings,
a first magnetization pinned layer facing the magnetic recording layer and configured to hold a magnetization direction thereof when passing the writing currents through the first and second wirings, and
a first nonmagnetic layer intervening between the magnetic recording layer and the first magnetization pinned layer; and
a first magnetic film covering a back surface and side surfaces of the first wiring, the back surface being opposite to a front surface of the first wiring that faces the magnetoresistance effect film, wherein each portion of the first magnetic film that covers the side surface of the first wiring extends across a plane including the front surface with an insulating film interposed between the magnetic recording layer and the portion of the first magnetic film covering the side surface of the first wiring.

34. The memory according to claim 33, wherein the first magnetic film further covers side surfaces of the first magnetization pinned layer with the insulating film interposed therebetween.

35. The memory according to claim 33, wherein the first magnetic film further covers side surfaces of the magnetic recording layer with the insulating film interposed therebetween.

36. The memory according to claim 33, wherein the magnetoresistance effect film further comprises,
   a second magnetization pinned layer configured to hold a magnetization direction thereof when passing the writing currents through the first and second wirings, the first and second magnetization pinned layers sandwiching the magnetic recording layer and the first nonmagnetic layer, and
   a second nonmagnetic layer intervening between the magnetic recording layer and the second magnetization pinned layer.

37. The memory according to claim 33, further comprising a second magnetic film covering a back surface and side surfaces of the second wiring, the back surface of the second wiring being opposite to a front surface of the second wiring that faces the magnetoresistance effect film.

38. The memory according to claim 33, wherein a length of the first magnetic film along a longitudinal direction of the first wiring is 1.2 times or more a length of the magnetoresistance effect film along the longitudinal direction of the first wiring.

39. The memory according to claim 33, wherein the first magnetic film comprises either a high saturation magnetization soft magnetic material containing cobalt or a metal-nonmetal nano-granular film.

40. The memory according to claim 39, wherein the first magnetic film comprises a high permeable magnetic material as the high saturation magnetization soft magnetic material, the high permeable magnetic material is an alloy containing cobalt or cobalt-iron as a main component, and the first and second wirings contain one material selected from the group consisting of copper, tungsten, and an alloy of copper and tungsten.

41. The memory according to claim 39, wherein the first magnetic film comprises a high permeable magnetic material as the high saturation magnetization soft magnetic material, the high permeable magnetic material is an alloy containing cobalt or cobalt-iron as a main component, and each of the first and second wirings has a multilayered structure including a nonmagnetic layer and a high saturation magnetization soft magnetic material layer.

42. The memory according to claim 39, wherein the first magnetic film comprises at least one film selected from the group consisting of a Co—Fe alloy film, a Co—Fe—Ni alloy film, a Co-(Zr, Hf, Nb, Ta, Ti) film, an amorphous film of these films, and a metal-nonmetal nano-granular film.

43. The memory according to claim 33, wherein the nonmagnetic layer is a nonmagnetic tunnel layer.

44. The memory according to claim 33, further comprising a sense current control element configured to control a sense current to be passed through the magnetic memory.

* * * * *